(12) United States Patent
Wegener

(10) Patent No.: US 8,631,055 B2
(45) Date of Patent: Jan. 14, 2014

(54) ENHANCED MULTI-PROCESSOR WAVEFORM DATA EXCHANGE USING COMPRESSION AND DECOMPRESSION

(75) Inventor: Albert W. Wegener, Portola Valley, CA (US)

(73) Assignee: Samplify Systems, Inc., Aptos Hills, CA (US)

( * ) Notice: Subject to any disclaimer, the term of this patent is extended or adjusted under 35 U.S.C. 154(b) by 592 days.

(21) Appl. No.: 12/891,312

(22) Filed: Sep. 27, 2010

(65) Prior Publication Data

US 2011/0078222 A1    Mar. 31, 2011

Related U.S. Application Data

(60) Provisional application No. 61/247,480, filed on Sep. 30, 2009.

(51) Int. Cl.
*G06F 17/10* (2006.01)

(52) U.S. Cl.
USPC .......................................................... 708/203

(58) Field of Classification Search
None
See application file for complete search history.

(56) References Cited

U.S. PATENT DOCUMENTS

| | | | |
|---|---|---|---|
| 5,185,819 A | 2/1993 | Ng et al. | |
| 5,765,157 A | 6/1998 | Lindholm et al. | |
| 5,839,100 A | 11/1998 | Wegener | |
| 5,974,471 A | 10/1999 | Belt | |
| 6,195,024 B1 | 2/2001 | Fallon | |
| 6,309,424 B1 | 10/2001 | Fallon | |
| 6,597,812 B1 | 7/2003 | Fallon et al. | |
| 6,862,662 B1 | 3/2005 | Cloud | |
| 6,988,114 B2 * | 1/2006 | Sirtori et al. | 708/203 |
| 7,009,533 B1 | 3/2006 | Wegener | |
| 7,071,852 B1 | 7/2006 | Wegener | |
| 7,129,860 B2 | 10/2006 | Alvarez, II et al. | |
| 7,378,992 B2 | 5/2008 | Fallon | |
| 8,301,803 B2 * | 10/2012 | Wegener | 709/247 |

(Continued)

FOREIGN PATENT DOCUMENTS

WO    2007135602 A1    11/2007

OTHER PUBLICATIONS

Mahapatra, Nihar et al., "The Performance Advantage of Applying Compression to the Memory System," ACM MSP'02, Jun. 2002, pp. 86-96.

(Continued)

*Primary Examiner* — David H Malzahn
(74) *Attorney, Agent, or Firm* — Carolyn Koenig; Haynes Beffel & Wolfeld LLP

(57) ABSTRACT

Configurable compression and decompression of waveform data in a multi-core processing environment improves the efficiency of data transfer between cores and conserves data storage resources. In waveform data processing systems, input, intermediate, and output waveform data are often exchanged between cores and between cores and off-chip memory. At each core, a single configurable compressor and a single configurable decompressor can be configured to compress and to decompress integer or floating-point waveform data. At the memory controller, a configurable compressor compresses integer or floating-point waveform data for transfer to off-chip memory in compressed packets and a configurable decompressor decompresses compressed packets received from the off-chip memory. Compression reduces the memory or storage required to retain waveform data in a semiconductor or magnetic memory. Compression reduces both the latency and the bandwidth required to exchange waveform data. This abstract does not limit the scope of the invention as described in the claims.

29 Claims, 28 Drawing Sheets

(56) References Cited

U.S. PATENT DOCUMENTS

| | | | |
|---|---|---|---|
| 2002/0152247 A1* | 10/2002 | Sirtori et al. | 708/203 |
| 2004/0243414 A1 | 12/2004 | Yamada et al. | |
| 2005/0204081 A1 | 9/2005 | Wang | |
| 2007/0067483 A1 | 3/2007 | Fallon | |
| 2008/0103710 A1 | 5/2008 | Wegener | |
| 2008/0126903 A1 | 5/2008 | Wegener | |
| 2009/0089454 A1 | 4/2009 | Huggahalli et al. | |
| 2009/0248986 A1 | 10/2009 | Citron et al. | |
| 2011/0078222 A1* | 3/2011 | Wegener | 708/203 |
| 2011/0099295 A1* | 4/2011 | Wegener | 709/247 |
| 2013/0054661 A1* | 2/2013 | Wegener | 708/203 |

OTHER PUBLICATIONS

Nitta, Christopher et al., "Techniques for Increasing Effective Data Bandwidth," IEEE International Conf. on Computer Design (ICCD), Oct. 2008, pp. 514-519.

International Search Report and Written Opinion mailed Jun. 1, 2011 in PCT/US2010/050420, 7 pages.

Lindstrom, Peter, et al., "Fast and Efficient Compression of Floating-Point Data," IEEE Trans. on Visualization and Computer Graphics, vol. 12, No. 5, Sep./Oct. 2006, 6 pages.

M. Burtscher and P. Ratanaworabhan, "gFPC: A Self-Tuning Compression Algorithm," 2010 Data Compression Conference, Mar. 2010. [DCC'10], pp. 396-405.

O'Neil et al., "Floating-Point Data Compression at 75 Gb/s on a GPU," GPGPU-4, Mar. 25, 2011, 7 pages.

Weyland, Nicholas J., et al., "Lossless Coding for Sources of Floating-Point and Fixed-Precision Numbers," IEEE Trans. on Information Theory, vol. 34, No. 4, Jul. 1988, 7 pages.

Benini, L et al. "Memory Energy Minimization by Data Compression: Algorithms, Architectures and Implementation." IEEE Transactions on Very Large Scale Integration (VLSI) Systems, vol. 12, No. 3, Mar. 2004, pp. 255-268.

Filgueira et al., Adaptive-Compi: Enhancing Mpi-Based Applications' Performance and Scalability by using Adaptive Compression, International Journal of High Performance Computing Applications, Jul. 26, 2010 at http://hpc.sagepub.com/content/25/1/93, 23 pages.

Filgueira, R., et al., "Exploiting data compression in collective I/O techniques," Cluster Computing, 2008 IEEE International Conference on, Sep. 29, 2008-Oct. 1, 2008, pp. 479-485.

Glaskowsky, Peter, white paper, "NVIDIA's Fermi: The First Complete GPU Computer Architecture," Sep. 2009, 26 pages.

Hammel, Michael J., "Embedded Linux: Using Compressed File Systems," downloaded from http://lwn.net/Articles/219827, Jan. 30, 2007, 7 pages.

Jian Ke, et al., "Runtime Compression of MPI Messages to Improve the Performance and Scalability of Parallel Applications," Supercomputing, 2004. Proceedings of the ACM/IEEE SC2004 Conference, Nov. 6-12, 2004, 7 pages.

Lekatsas/Yang et al., "CRAMES: compressed RAM for embedded systems," Hardware/Software Codesign and System Synthesis, 2005. CODES+ISSS '05. Third IEEE/ACM/IFIP International Conference on, Sep. 2005, pp. 93-98.

Mahapatra, N. et al. "The Performance Advantage of Applying Compression to the Memory System." ACM Workshop on Memory System Performance (MSP 2002), Jun. 2002, pp. 86-96.

Nitta, C. et al. "Techniques for Increasing Effective Data Bandwidth." IEEE International conference on Computer Design, Oct. 2008, pp. 514-519.

NVIDIA White Paper "NVIDIA's Next Generation CUDA Compute Architecture: Fermi," available at http://www.nvidia.com/content/PDF/fermi_white_papers/NVIDIA_Fermi_Compute_Architecture_Whitepaper.pdf</url>, 2009, 22 pages.

Wolfe, M., and C. Toepfer. "The PGI accelerator programming model on NVIDIA GPUs." The Portland Group Insider (Jun. 2009), 27 pages.

* cited by examiner

| STANDARD | HEADER SIZE | PAYLOAD SIZE |
|---|---|---|
| PCI EXPRESS | 12 - 16 BYTES | 64 - 4069 BYTES |
| ETHERNET | 38 - 42 BYTES | 64 - 1518 BYTES |
| HYPERTRANSPORT | 4 - 8 BYTES | 0 - 64 BYTES |
| QUICK PATH INTERCONNECT | 8 BYTES | 0 - 64 BYTES |
| RAPID I/O | 6 BYTES | 16 - 256 BYTES |

Figure 5
Prior Art

| CONFIGURATION | DISTANCE | MEMORY TYPE |
|---|---|---|
| 2+ cores in one IC | um - mm | Cache |
| 2+ ICs on one board | mm - cm | Cache/FIFO/RAM |
| 2+ ICs on 2+ boards (same chassis) | cm - m | FIFO/RAM |
| 2+ ICs on 2+ boards (another chassis) | m - km | FIFO/RAM |

Figure 8
Prior Art

|  | WITHOUT COMPRESSION | WITH 2:1 COMPRESSION |
|---|---|---|
| TRANSFERRED PACKET SIZE | 1 MB | 500 kB |
| CORE1 TX + COMPRESS LATENCY | 0.001 sec | 0.01 sec |
| CORE 1 TO CORE 2 TRANSFER TIME (1 MB/sec link) | 1 sec | .5 sec |
| CORE 2 RX + DECOMPRESS LATENCY | 0.001 sec | 0.01 sec |
| TOTATL TRANSFER TIME FOR 1 MB | 1.002 sec | 0.52 sec |
| TOTAL TRANSFER BANDWIDTH | 998 kB/sec | 1923 kB/sec |

Figure 19

ENHANCED MULTI-PROCESSOR WAVEFORM DATA EXCHANGE USING COMPRESSION AND DECOMPRESSION

CROSS-REFERENCE TO RELATED APPLICATION

Claim is made of the benefit of U.S. Provisional Application No. 61/247,480, filed Sep. 30, 2009.

BACKGROUND

The present invention is directed to the compression of waveform data for data transfers among computing cores and for data writes to memory and later decompression upon data reception at a computing core or data reads in a multiple core processing architecture, especially the compression of both integer and floating-point numerical data types. The present invention supports the selection of lossless, fixed-rate, or fixed-quality compression modes on all data types.

In waveform data processing applications, the central processing unit (CPU) of a microprocessor or other signal processing fabric performs arithmetic and logical operations on waveform data values under the control of a stored program in order to transform waveform data values in an application-specific way. Input, intermediate, and output waveform data values are retrieved from storage, memory or input devices, processed, and provided to storage, memory or output devices. The waveform data may be represented by integer and floating-point numerical data types. Examples of such waveform data processing applications include but are not limited to:

receiving and transmitting mobile telephone signals in a cellular telephone, recording and playing audio in a portable audio player, retrieving compressed video from a DVD, decompressing the compressed video, and transmitting the decompressed video to a display device, recording and playing back digitized speech in a voice recorder, and simulating chemical, molecular, electrical, or biological processes.

The waveform data processing industry is composed of a staggering number of manufacturers who offer a broad range of waveform data processing engines and waveform data storage devices. Waveform data processing engines are most often implemented using a digital signal processor (DSP)—enabled CPU that supports multiply-accumulate (MAC) operations using dedicated assembly language instructions such as MPY and MAC. Companies offering CPUs that have MPY and MAC instructions for waveform processing applications include Intel Corporation (the x86 instruction set family of processors, including the Pentium, Nehalem, Itanium, Larrabee, and other processors), Nvidia graphics processing units (GPUs), Advance Micro Devices (AMD) family of x86-compatible CPUs, AMD/ATI GPUs, Texas Instruments (the TMS320 DSP family), Analog Devices (the Blackfin, TigerSharc, SHARC, and ADSP-21xx families), Motorola (the PowerPC and 56xxx families), ARM (the Cortex, 7, ARM9, ARM10, and ARM11 families), MIPS Technology (the R2000 through R16000, MIPS16, MIPS32, MIPS64, and MIPS DSP families), Microchip (the dsPIC family), IBM (the PowerPC family), and many others. Waveform data processing applications can also be implemented using a programmable fabric of logic, arithmetic, and storage elements in a field-programmable gate array (FPGA). Companies offering FPGAs that are used for waveform data processing applications include Altera (the Cyclone, Arria, and Stratix families), Xilinx (the Spartan and Virtex families), Actel (the Axcelerator and ProASIC families), Lattice (the XP, ECP, and SC families), and many others. Waveform data processing applications can also be included in application-specific integrated circuits (ASICs) that are designed to perform specific waveform data processing operations. ASIC vendors include TSMC, UMC, IBM, LSI Logic, and many others.

The DSP, FPGA, ASIC, and memory market segments are all sub-segments of the semiconductor industry. The terms "memory" and "storage" are used interchangeably in the following description for devices and subsystems that temporarily or permanently store integer or floating-point sampled data values used in waveform data processing applications. Waveform data memories may include the following semiconductor categories: static random access memories (SRAM), dynamic random access memories (DRAM), double and quadruple data rate random access memories (DDR and QDR), flash memories, solid state drives (SSD), flash drives, disk drives, ferro-magnetic random access memories (FRAM), cache memories, and any other future semiconductor memories used to store waveform data. Companies making semiconductor memory or storage devices include SRAM manufacturers include Cypress, Dallas Semiconductor, Honeywell, Hynix, IDT, Micron, Mitsubishi, NEC, Renesas, Sharp, Sony, Toshiba, UTMC/Aeroflex, White Electronic Design, and others; DRAM manufacturers Samsung, Hynix, Micron, Elpida, Nanya, Qimonda, ProMOS, Powerchip, and others; flash memory manufacturers include Samsung, Toshiba, Intel, ST Microelectronics, Renesas, Hynix, and others; FRAM manufacturers include Fujitsu, Ramtron, and Samsung.

In this description, "waveform data processing applications" include applications that perform mathematical and/or logical operations on sampled data waveforms. Sampled data waveforms are often (but not exclusively) obtained by digitizing real-world analog signals such as speech, audio, images, video, or other sensor output signals using an analog-to-digital converter (ADC). Sampled data signals can also be simulated and can either be fed directly, or after additional waveform data processing operations, to a digital-to-analog converter (DAC) in order to generate analog speech, audio, images, or video signals. In this description, the term "sampled data waveforms" also includes such intermediate and/or final sampled data waveforms generated from mathematical and/or logical operations performed upon input or intermediate sampled data waveforms.

Waveform data are preferentially stored in two primary numerical formats: integer formats and floating-point formats. Integer formats represent waveform data using signed, unsigned, or sign-and-magnitude representations, where the width of the sampled data value is typically fixed. Common integer formats suitable for waveform data processing are 8-bit and 16-bit signed integers in the range $\{-128, +127\}$ and $\{-32768, +32767\}$, respectively, and 8-bit and 16-bit unsigned integers in the range $\{0, 255\}$ and $\{0, 65535\}$, respectively. Alternately, waveform data may be represented in 32-bit, 64-bit, and 128-bit floating-point formats. The most common floating-point formats conform to the IEEE-754 standard for floating-point values. The IEEE-754 standard was originally issued in 1985 and was subsequently updated in 2008. The IEEE-754 standard represents 32-bit floating-point values (also called "floats" or "single-precision floats") using one sign bit, 8 exponent bits, and 23 mantissa bits. The IEEE-754 standard represents 64-bit floating-point values (also called "doubles" or "double-precision floats") using one sign bit, 11 exponent bits, and 52 mantissa bits. Other floating-point representations exist, such as 16-bit "half floating point," but operations on floats and doubles is usually supported in a CPU or DSP processor with dedicated floating-point circuitry. Such circuitry is often called a floating-point unit or FPU. In many applications floating-point calculations are much faster, and consume much less power, when the floating-point data are represented in single-precision format, rather than double-precision format.

Storage devices used in waveform data processing applications exhibit varying access times. The fastest storage elements, with access times below 10 nsec, are usually SRAMS that can be fabricated on the same semiconductor die or integrated circuit (IC) with the processor cores. Such SRAM storage is called cache memory, on-chip memory, or register files. The slowest semiconductor storage elements are typically flash memories, with access times to individual sampled data elements in the 100 nsec to 1 microsec range. Flash memory writes are slower than flash memory reads. Memory technologies are commonly arranged in a hierarchy, with the fastest storage elements nearest the CPU or DSP processing fabric, with slower storage elements layered around the faster storage elements. The terms "on-chip" and "off-chip" are adjectives used to characterize the proximity of storage to the CPU or processing fabric. On-chip storage is on the same semiconductor substrate, or packaged in the same multi-chip module (MCM) as the CPU or processing fabric. Off-chip storage is located on a separate integrated circuit (IC) from the CPU or processing fabric. Other slow storage elements include disk drives and tape drives, whose access times are tens of msec and whose data rates are typically 100 MB/sec or lower.

Given the layered hierarchy of memory used in waveform data processing applications, it is a continuing goal of applications that process waveform data to improve the CPU or signal processing fabric's access time to sampled data stored in memory. A secondary goal is to reduce the latency between CPU or signal processing fabric requests for waveform data and the appearance of that data in memory (typically cache or register file) that is directly accessible to the CPU or signal processing fabric. A third goal is to reduce the complexity of the fabric that connects waveform data processor cores to their memory hierarchy.

Techniques exist for compressing and decompressing both instructions and data in waveform processing applications. Many compression or encoding techniques can accept data in only one waveform data format, for example integer data or floating-point data, but not both. Similarly, many compression or encoding techniques offer only one compression mode, such as lossless mode or lossy mode, but not both. Many compression or encoding techniques are only applicable to a certain class of waveform data such as speech, audio, images, or video, but do not provide sufficient compression on other classes of waveform data. Many compression or encoding techniques operate on (address, data) pairs, which are typically found in memory controllers for SRAM, DRAM, or flash.

In a multi-core waveform processing system, many types of waveform data may be represented using different data formats. The programs for the particular application typically define the data format. The purpose of multi-core processing architectures is to perform computationally intensive operations, generally on high volumes of data. There is a need for compression of the waveform data for transmission among the computing cores and between the cores and memory to enable rapid transfer of high volumes of data in compute-intensive applications.

This description uses the terms integrated circuit (IC) and chip interchangeably to refer to a single package with electronic or optical connections (pins, leads, ports, etc.) containing one or more electronic die. The electronic die, or semiconductor die, is a semiconductor substrate that includes integrated circuits and semiconductor devices. The die may have a single core or a plurality of cores. The core may be a processing unit for any type of data processor. For example, a processor core may be a central processing unit (CPU), a digital signal processor (DSP), a graphics processing unit (GPU), a microcontroller unit (MCU), a communications processor or any type of processing unit. The individual cores on a single die may be the same type of processing unit or a combination of different types processing units appropriate for the application. Such processing units may include (but are not limited to) a memory controller, a direct memory access (DMA) controller, a network controller, a cache controller, and a floating-point unit (FPU). Such processing units may be integrated on the same die with one or more processor cores or may be on a separate die from the processor cores.

In this description, "real time" applied to compression means that a digital signal is compressed at a rate that is at least as fast as the sample rate of a digital signal. The attribute "real time" can also describe rates for processing, transfer and storage of the digital signal, as compared to the original signal acquisition rate or sample rate. The sample rate is the rate at which an ADC or DAC forms samples during conversion between digital and analog signals. The bit rate of an uncompressed sampled, or digital, signal is the number of bits per sample multiplied by the sample rate. The compression ratio is the ratio of the bit rate of the original signal samples to the bit rate of the compressed samples. In a waveform data processing application that simulates the function of a real-time system, the sequence of operations performed on the sequence of waveform data values may be identical to a real-time processing sequence, but the rate at which the processing is performed may be slower than "real time." This description refers to such applications as simulated waveform data processing applications.

This description refers to various communications fabrics. A communications fabric is any connection between two processing cores that allows two or more cores to communicate with each other. Examples of communications fabrics include a bus, a network, the traces on a printed circuit board, a wireless link including a transmitter and a receiver, a switch, a network interface card (NIC), a router, a network-on-chip, or any other wired or wireless connection between two processor cores.

This description refers to lossless and lossy compression. In lossless compression, the decompressed samples have identical values to the original samples. In some applications, lossy compression may be necessary to provide sufficient bit rate reduction. In lossy compression, the decompressed samples are similar, but not identical, to the original samples. Lossy compression creates a tradeoff between the bit rate of the compressed samples and the distortion in the decompressed samples.

SUMMARY OF THE INVENTION

Embodiments of the present invention have been made in consideration of the foregoing conventional problems. Objects of the present invention include the following.

(A) Compression of waveform data at two or more processor cores for transfer between processor cores in a multi-core processing system.

(B) Compression of the waveform data at a processor core, or CPU, for transfer between the processor core and elements of the waveform data memory hierarchy.
(C) Compression of the waveform data for distribution from an input controller to multiple processor cores.
(D) Compression of processed waveform data at one or more processor cores for transfer of compressed data to an output controller.
(E) Decompression at a receiving CPU of compressed data received from a transmitting CPU, an input controller or memory.
(F) Decompression of compressed data at the output controller to reconstruct the processed waveform data.
(G) Configurable compression and decompression of integer and floating-point data formats of waveform data in a multi-core processing environment.
(H) Configurable compression and decompression of integer and floating-point data formats of waveform data in a single processor core for transfer or retrieval from memory.
(I) A single configurable compressor having operational modes for compressing integer and floating-point data formats.
(J) A single configurable decompressor having operational modes for reconstructing integer and floating-point data from previously compressed data.
(K) The compressor forming a compressed payload of a data packet for transmission of the compressed waveform data across a packet-based communications interface.
(L) The decompressor retrieving the compressed payload data from a packet-based communications interface and reconstructing the corresponding waveform data.
(M) Configuring the compressor to apply lossless or lossy compression under user control or automatic selection.
(N) Configuring the decompressor to apply lossless or lossy decompression according to a control parameter.
(O) Adapting the compression operations to produce compressed data having a fixed compressed bit rate.
(P) Adapting the compression operations to produce compressed data having a fixed quality metric.

Compression of the waveform data provides several advantages by conserving resources of a multi-core processing system. In a multi-core processing system, the input, intermediate, and output waveform data are often shared and exchanged between cores. Compression reduces the latency and the bandwidth required to exchange such waveform data between two or more cores. Compression reduces the power and area required to transmit waveform data between processor cores. A further advantage is the decrease in pin count and printed circuit board trace area required to allow multiple processors to exchange waveform data. Compression reduces the memory or storage required to retain waveform data in a semiconductor or magnetic memory, thus increasing the memory's effective capacity. Compression of waveform data reduces both the access time and the latency when transferring waveform data between the CPU and elements of the waveform data memory hierarchy. In summary, the advantages of the present invention include reducing the complexity, cost, and power of compressing transmitters and decompressing receivers that exchange waveform data in a single or multi-core processing environment.

The waveform data can be used in common by multiple threads being executed in parallel on multiple processor cores. The multiple threads can be forced to enter waiting modes, as a thread on one core needing part of the waveform data to continue execution, waits for a thread on another core complete processing the data and to send it to the waiting thread. These waiting modes are a critical performance bottleneck for multi-processor systems that run multiple threads operating in parallel on common waveform data. The time required for communication of the common waveform data among processing cores, and for communication the common waveform data with input and output resources of the multi-processor systems contribute to this critical performance bottleneck.

BRIEF DESCRIPTION OF THE DRAWINGS

FIG. 5 contains a table of packet-based protocols that conform to an industry standard.
FIG. 8 contains a table that relates multi-core configurations, core-to-core distance, and memory type to one another.
FIG. 11 illustrates two example integrations of the present invention's configurable compressor and decompressor in existing multi-core waveform data processors.
FIG. 19 contains a table that compares an example of data transfer time with and without compression.

DETAILED DESCRIPTION

The present invention is directed to the configurable compression and decompression of waveform data in a multi-core processing environment. In a multi-core processing system, each core may perform separate computations of a subset of waveform data. The input, intermediate, and output waveform data may be shared and exchanged between cores and a memory hierarchy. The present invention reduces both the latency and the bandwidth required to exchange such waveform data between two or more cores. The present invention is also suitable for reducing the memory or storage required to retain waveform data in a semiconductor or magnetic memory by compressing the waveform data during memory or storage writes, and decompressing the waveform data during memory or storage reads.

Figure 1A:
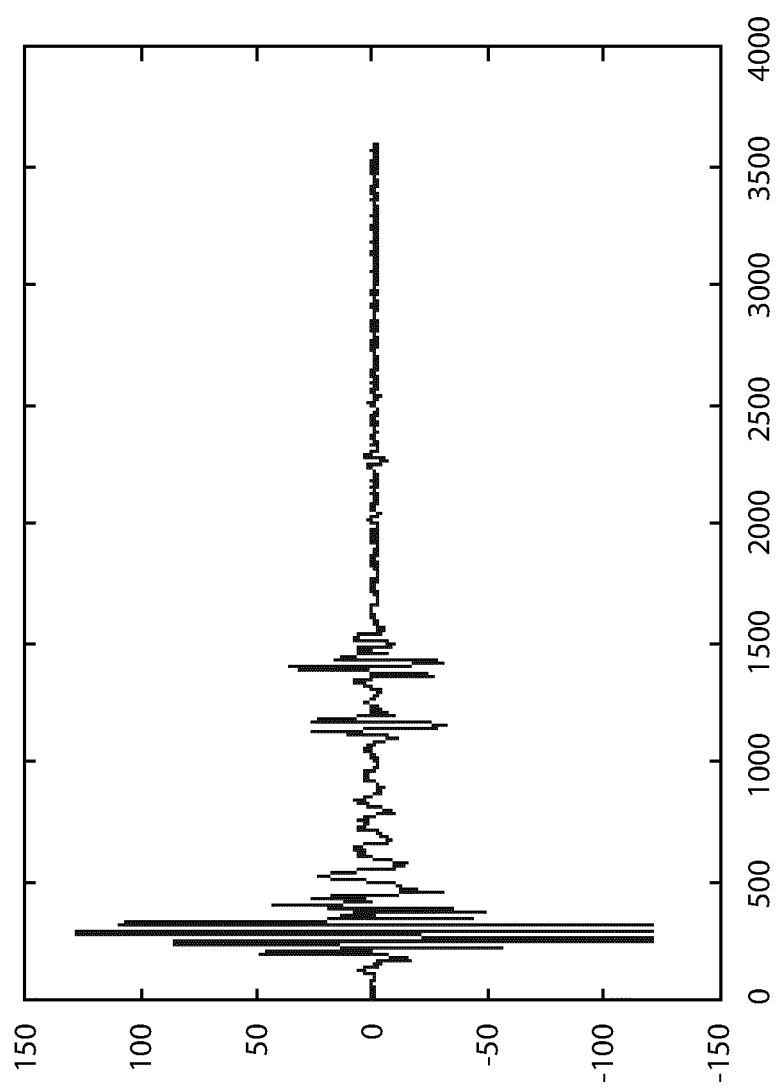
FIGS. 1a-1c illustrate three classes of waveform data.

FIG. 1 illustrates three examples of waveform data. FIG. 1a shows a graph of a pulsed waveform that is typical of signal pulses used in radar and ultrasound applications. The waveform data in FIG. 1a is processed as 8-bit signed integer values in the range {−128, +127} as indicated by the range of values on the y axis. FIG. 1a's x axis indicates that approximately 3500 samples comprise the waveform data pulse. FIG. 1a is a specific instance of the general class of two-dimensional waveform data, where one axis represents a time-varying property of a signal, and the second axis typically represents a temporal dimension (time or sample count). The particular waveform data property expressed by a two-dimensional waveform data graph will vary from application to application.

Figure 1B:
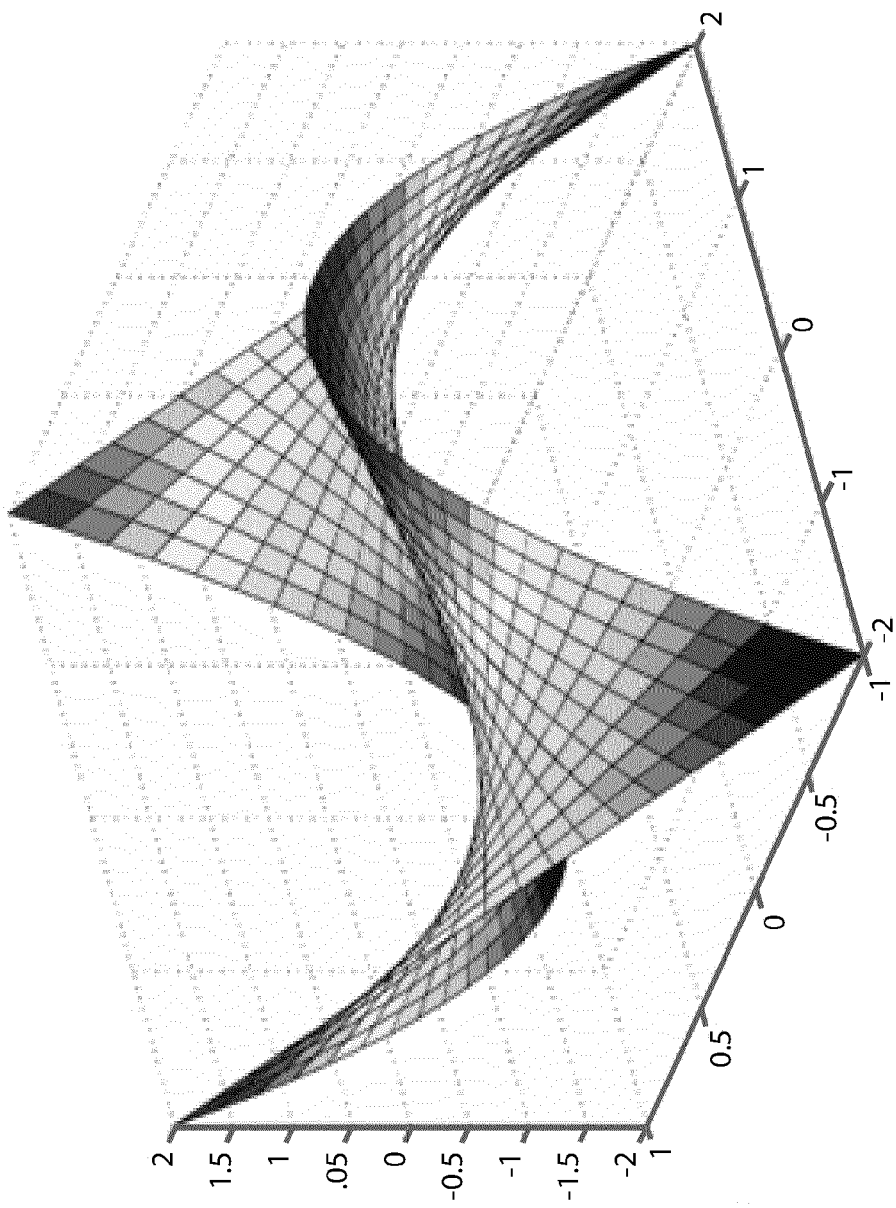

FIG. 1b shows a three-dimensional graph of a curved surface computed for a scientific or mathematical application. The z-axis indicates that the waveform data values are in floating-point format and are within the range {−2.0, +2.0}. The x and y axes values are in the range {−1, +1} and {−2, +2} respectively. FIG. 1b is a specific instance of the general class of three-dimensional waveform data, where the vertical axis represents a time-varying property of a signal, and the second and third axes represent two other dimensions (perhaps spatial location on a two-dimensional grid). The particular waveform data property expressed by a three-dimensional waveform data graph will vary from application to application.

Figure 1C:
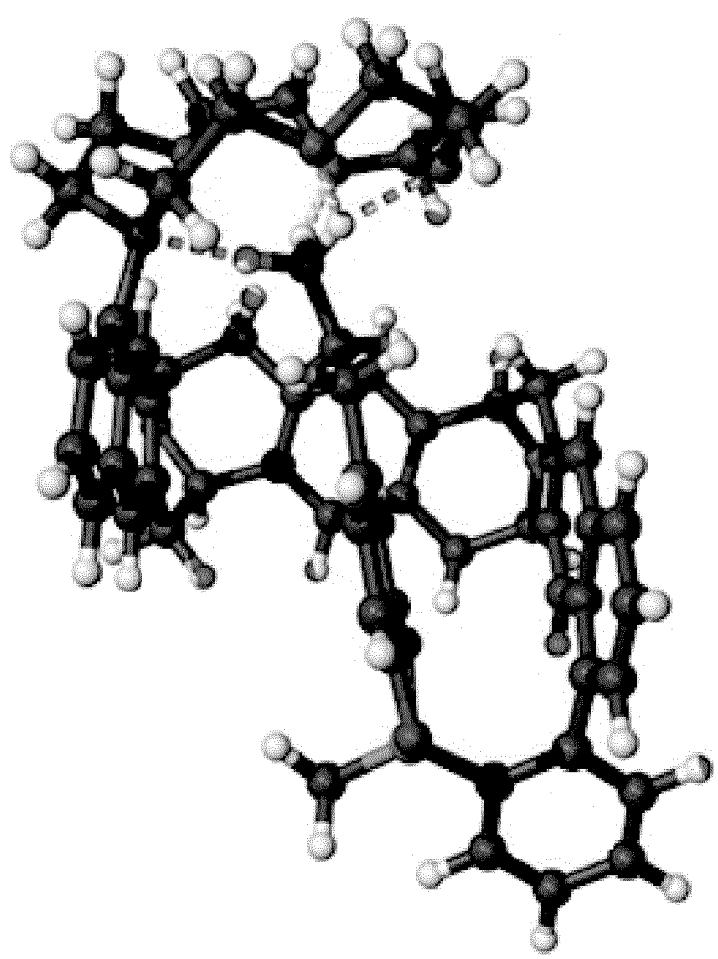

FIG. 1c is a plot of a three-dimensional molecule from a chemistry simulation. FIG. 1c does not include axes, but it is likely that the molecular dimensions and configuration shown are a visualization of internal floating-point waveform data produced by the simulation. FIG. 1c is a specific instance of the general class of three-dimensional waveform data, where the data can be represented as a three-dimensional object. The particular waveform data property expressed by a three-dimensional object will vary from application to application.

FIGS. 1a, 1b, and 1c are examples of broad classes of waveform data. Common characteristics of waveform data may include, but are not limited to, the following:

1. Data values represented in integer format or floating-point format,
2. Data values occur in a particular sequence based on a sampling process or a simulation,
3. Data values have a particular relationship to adjacent data values,
4. Mathematical operations such as addition, subtraction, multiplication, division, or weighted averages are often performed on adjacent data values in a sequence,
5. Adjacent data values are often correlated with each other.

Figure 2:
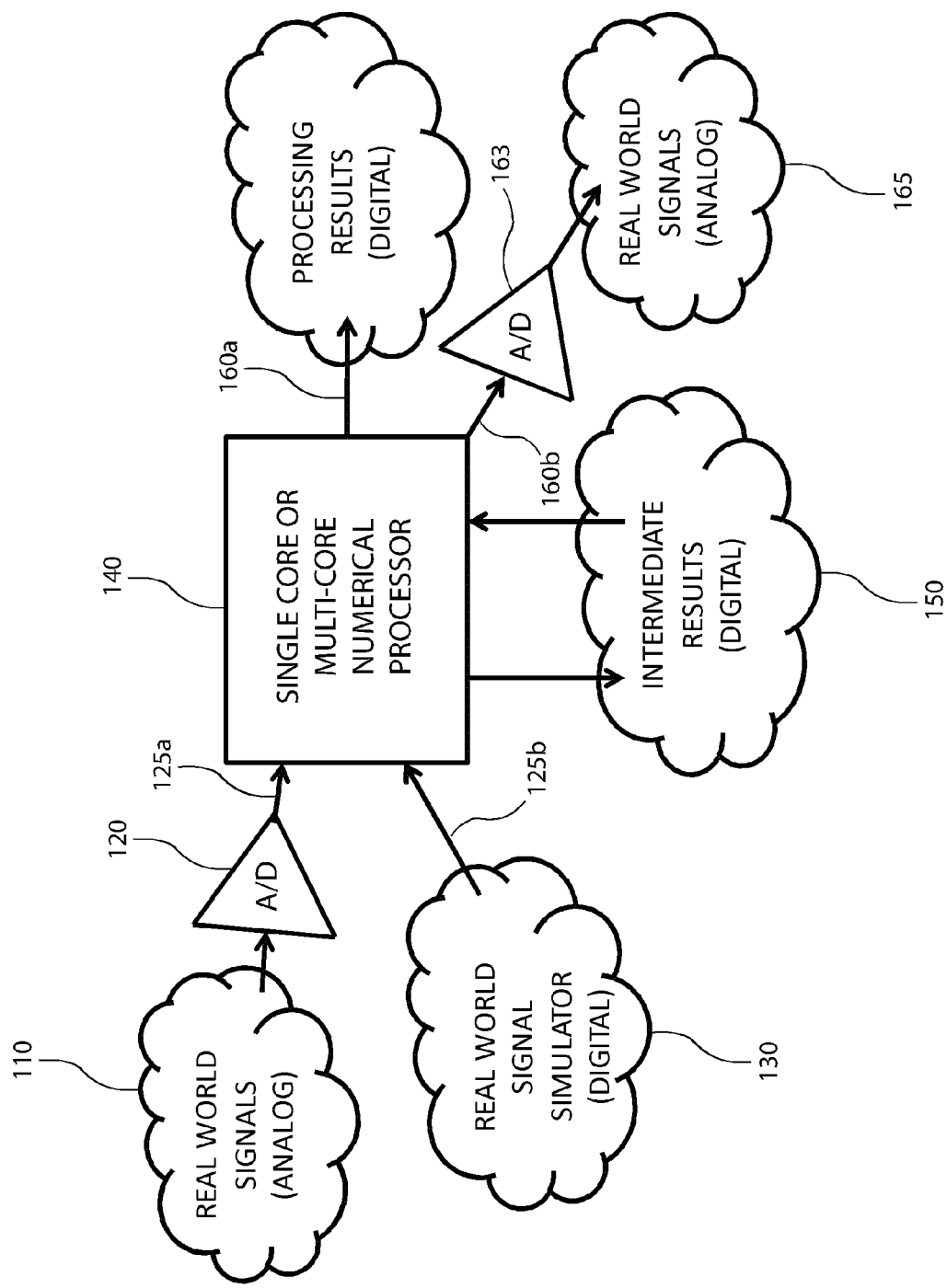
FIG. 2 illustrates the common elements in waveform data processing applications.

FIG. 2 illustrates a processing environment for waveform data processing. A real-world analog signal may be provided by a sensor or a detector. The analog-to-digital converter (ADC) 120 digitizes real-world analog signal(s) 110 to generate digitized waveform data 125a. The numerical processor 140 may include a single core or multiple cores (multi-core). Numerical processor 140 performs mathematical and/or logical operations on the digitized waveform data 125a, generating optional intermediate digital results 150 and digital processing results 160a. In certain applications numerical processor 140 receives simulated digital waveform data 125b from a real-world signal simulator 130, instead of, or in addition to, digitized waveform data 125a. In certain applications the digitized processing results 160b are applied to a digital-to-analog converter (DAC) 163, generating real-world analog output 165. In many applications digitized waveform data 125a, simulated digital waveform data 125b, intermediate digital results 150, digital processing results 160a, and digitized processing results 160b experience bandwidth bottlenecks into, or out of, numerical processor 140. Embodiments of the present invention reduce these bandwidth bottlenecks for waveform data.

Figure 3:
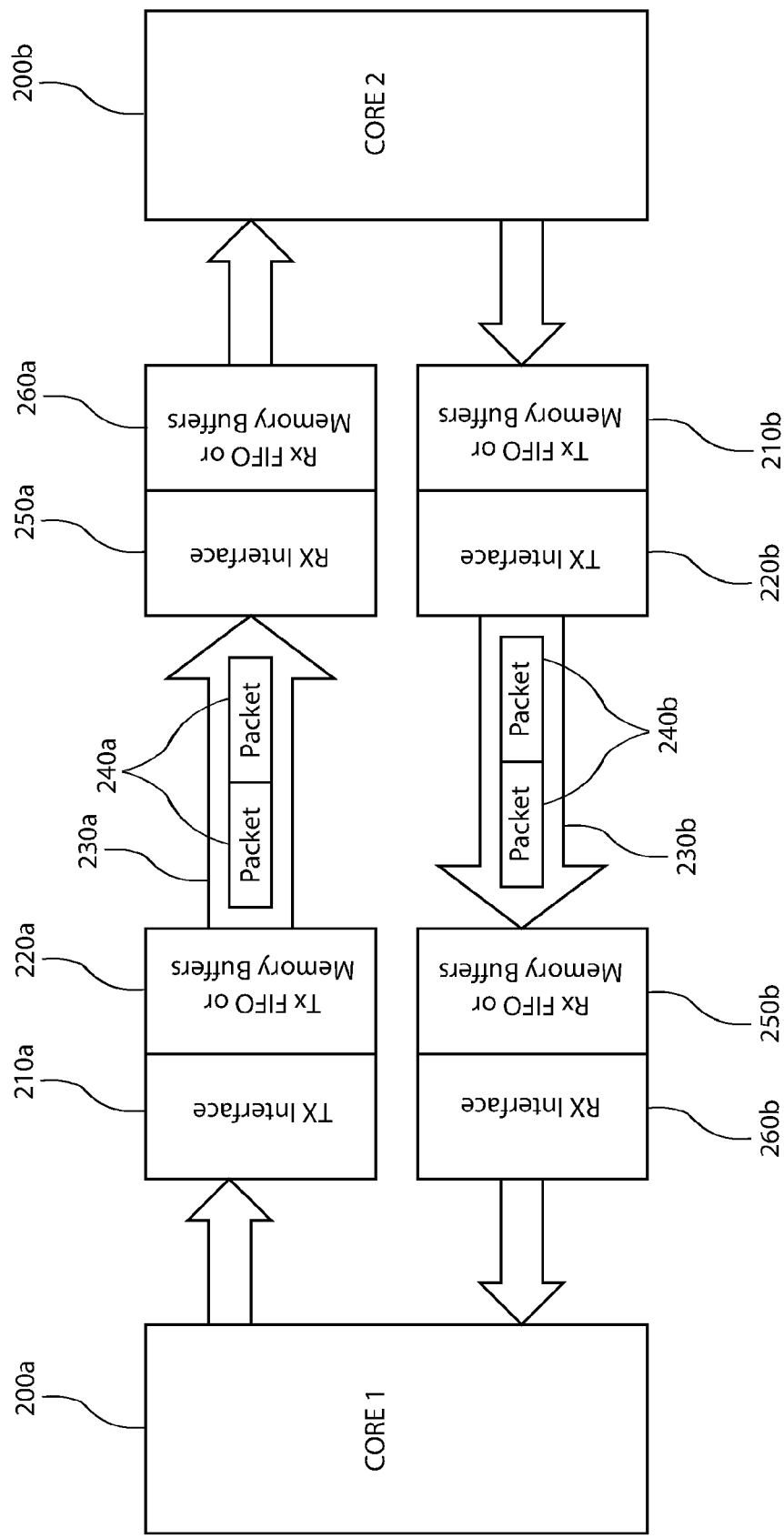
FIG. 3 illustrates a bi-directional, packet-based waveform data exchange pipeline between two processing elements.
Figure 4:
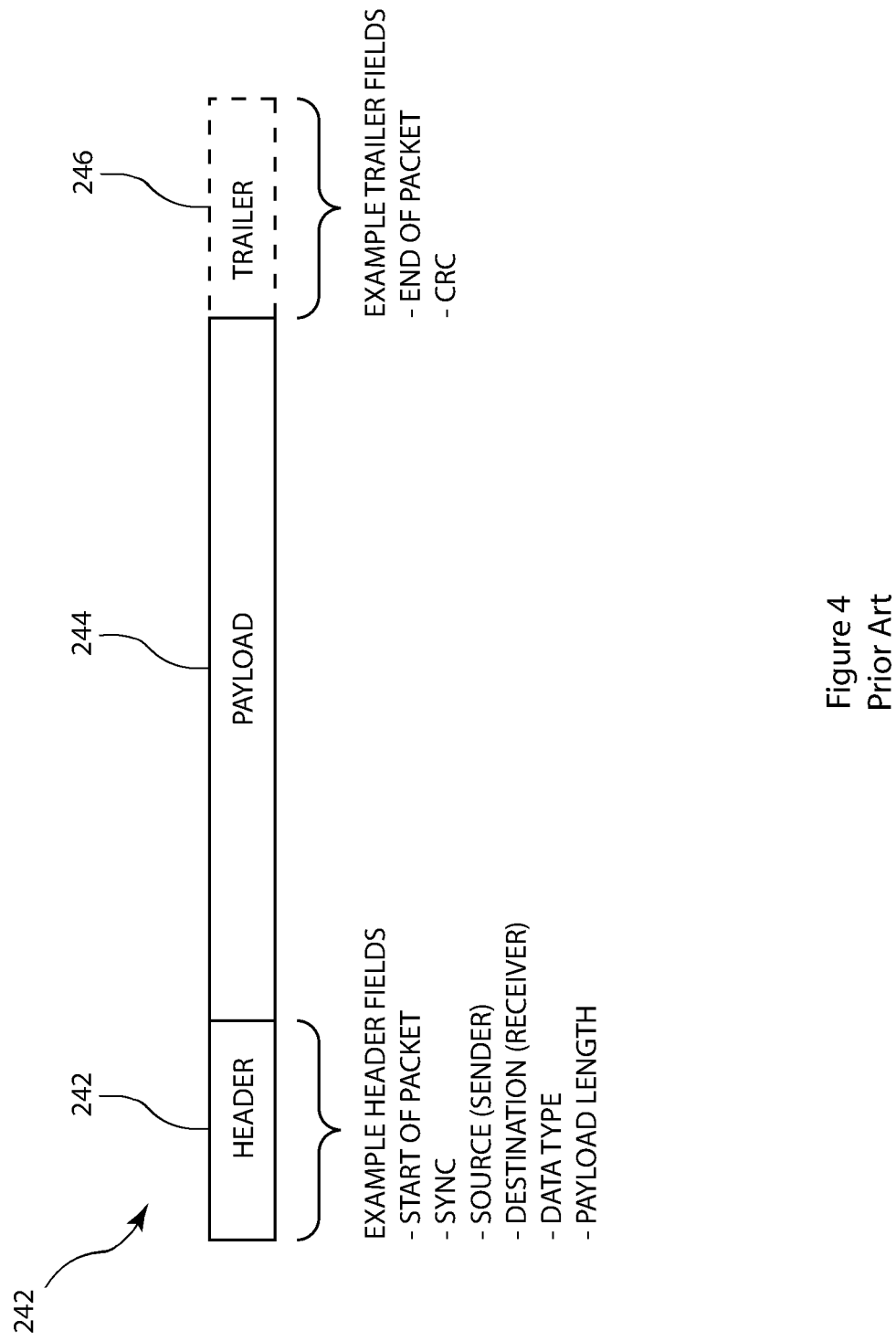
FIG. 4 illustrates the typical fields in a packet used to exchange data.

FIG. 3 illustrates a typical core-to-core interface between two directly connected processor cores. Core 200a and core 200b communicate through a bi-directional, full-duplex receive (Rx)-transmit (Tx) subsystem. Core 200a transmits information to Core 200b using transmit interface 210a and Tx FIFO or memory buffer 220a. For packet-based communication, transmit channel 230a carries packets that typically have a maximum payload size (packet capacity). Transmit interface 210a divides payloads larger than this maximum payload size into multiple transmit packets 240a that conform to the maximum payload size of the packet protocol. FIG. 5 (described below) lists typical packet payload sizes for common packet-based communications protocols. To support the transmission of packets having different priorities, Tx FIFO or memory buffer 220a may contain multiple FIFOs or memory buffers and a memory controller (not shown) that sends the packet whose priority is highest across transmit channel 230a at any given moment, from among the multiple FIFOs or memory buffers 220a. Core 200b receives packets from transmit channel 230a using an Rx FIFO or memory buffer 250a and an Rx interface 260a. Rx FIFO or memory buffer 260a may contain multiple FIFOs or memory buffers corresponding to the Tx FIFO or memory buffer 220a that temporarily store received packets in buffers that hold packets of different priority. Multi-priority core-to-core interfaces allow the packet protocol to support quality of service (QoS), real-time, and prioritized communication. Core 200b is informed of the availability of newly arrived packets from Core 200a by the Rx interface 260a, possibly with an optional interrupt to Core 200a (not shown). Core 200b transmits packets to Core 200a through an analogous communications chain, including Tx interface 210b, Tx FIFO or memory buffer 220b, transmit channel 230b, transmit packets 240b, Rx FIFO or memory interface 250b, and Rx interface 260b. The only distinction is in the packet direction (from Core 200a to Core 200b, or from Core 200b to Core 200a). FIG. 4 illustrates the components of a typical packet 240. Packet protocols usually begin with a packet header 242, followed by a packet payload 244, and conclude with an optional packet trailer 246. The packet header 242 contains both mandatory and optional fields that are specified by the particular packet protocol or standard. Mandatory packet fields usually include a start-of-packet or synchronization indicator, and an identifier for the source (sender) and destination (receiver) of the packet. Optional packet header fields may include fields for the payload data type (control or data; packet priority, etc.) and payload length. The portion of the packet 240 carrying data is referred to as the payload portion 244, or data portion. Depending on the packet protocol or standard, packet payload 244 may have a fixed size that never varies, a varying size payload between header 242 and trailer 246 (no packet length indicator in packet header 242), or a varying size payload whose length is included in packet header 242. The payload contents vary depending on the packet protocol or standard, but most packet protocols and standards allow units of bytes (8 bits), words (16 bits), longwords (32 bits), and floating-point (32 bits or 64 bits). Sometimes the data type of the packet payload being carried is not known to the lower layers of the packet protocol. An optional packet trailer 246 may include a cyclic redundancy check (CRC) that aids in the detection and possible correction of errors in the received packet, or an end-of-packet field.

FIG. 5 is a table comparing various computer industry standards for communications protocols that include both header and payload fields. The standards include PCI Express (PCIe), Ethernet (whose variants are usually referred to including their data rates, such as 10baseT [10 Mbps], 100baseT [100 Mbps], 1GbaseT or GbE [1 Gbps], 10GbaseT or 10 GbE [10 Gbps]), HyperTransport, QuickPath Interconnect (QPI), Infiniband and RapidIO. These standards are illustrative of packet-based protocols and additional protocols may develop in the future. As shown in FIG. 5, the packet header lengths vary from 4 to 42 Bytes, while the allowed payload sizes vary from 0 to 4096 Bytes. An embodiment of the present invention compresses numerical data (integer and/or floating-point values) contained in the packet payload.

Figure 6A:
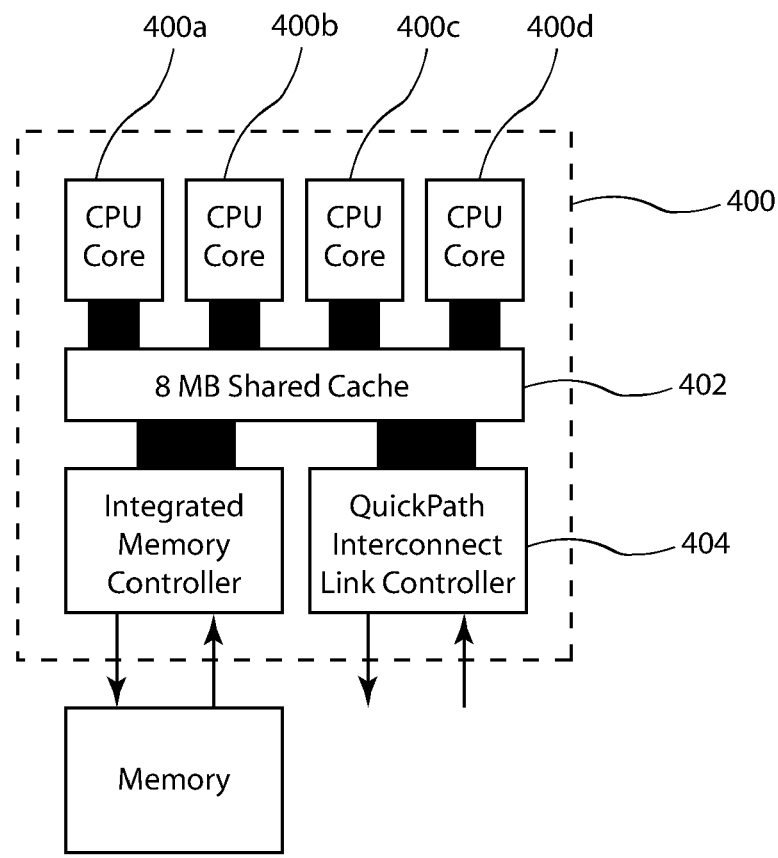
FIGS. 6a-6e illustrate multi-core products suitable for waveform data processing offered by a variety of semiconductor and CPU vendors.

FIGS. 6a through 6e illustrate multi-processor configurations from a variety of vendors. The examples of FIG. 6 are illustrative of commercial multi-core processors as of 2009 and other architectures may develop in the future. FIG. 6a illustrates the Intel Nehalem CPU architecture. The Intel Nehalem CPU contains four processor cores 400a, 400b, 400c, and 400d on one die, with a shared cache 402 having a capacity of 8 MB. The processor cores 400a through 400d access other computer system peripherals through a pair of QPI interfaces 404. The QPI interfaces 404 use a packet-based communication protocol. The compression described herein may be integrated with the QPI interface 404.

Figure 6B:
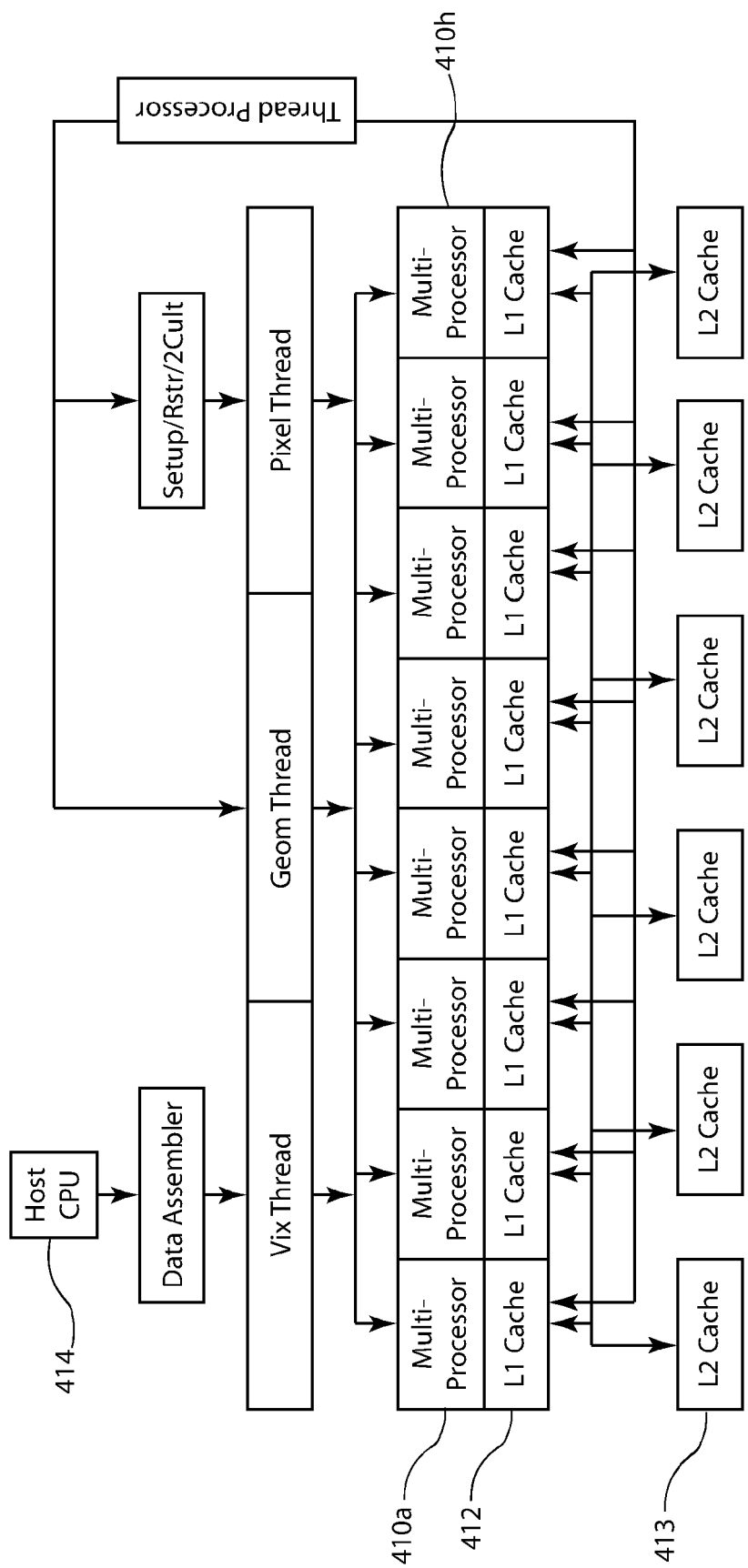

FIG. 6b illustrates the Nvidia GeForce 8800 GPU architecture. The Nvidia GeForce 8800 GPU includes 64 processors grouped into 8 multi-processors 410a through 410h. Each multi-processor includes 8 cores. The multi-processors 410a through 410h utilize distributed Level 1 (L1) cache 412 and distributed Level 2 (L2) cache 413 to store input values, intermediate results, and output values, and to exchange such values between cores. The GeForce 8800 receives input data values and transmits output data values from and to a host CPU 414. The compression described herein may be integrated into the host-to-GPU and GPU-to-host communications controller for the data assembler.

Figure 6C:
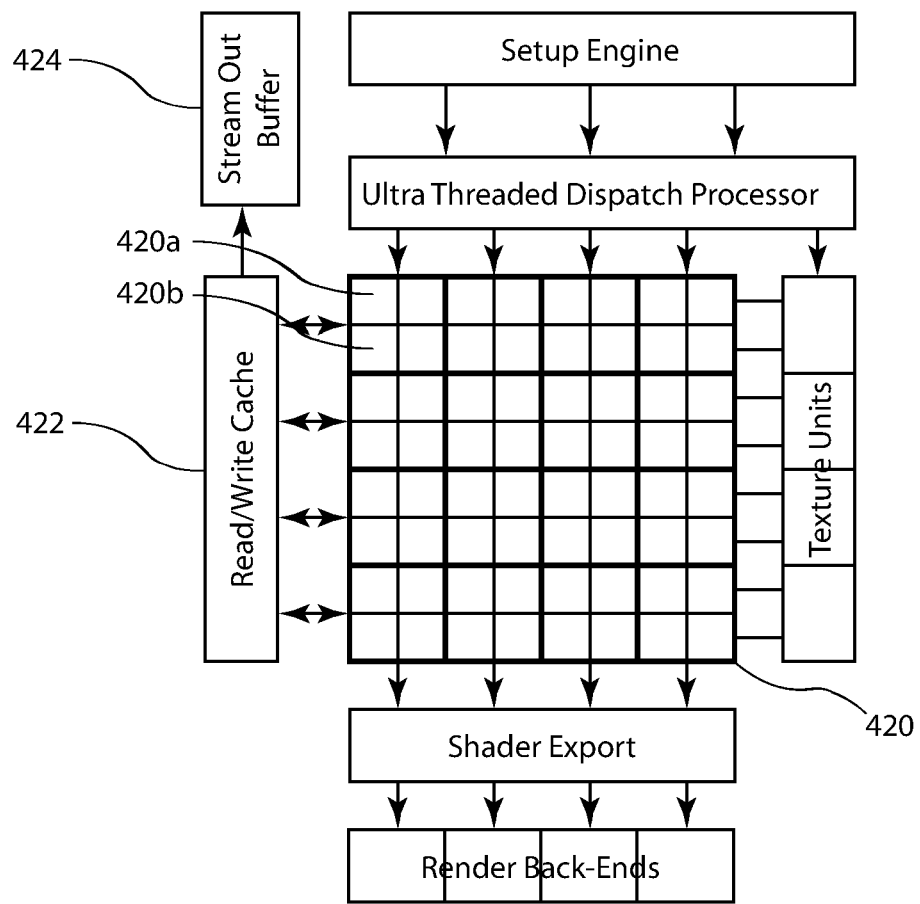

FIG. 6c illustrates an AMD/ATI multi-core GPU architecture. The AMD/ATI GPU includes 64 stream processing units 420, such as processing units 420a and 420b. Stream processing units 420 share a common read/write cache 422 and stream output buffer 424. The compression described herein may be integrated into the stream I/O communications controller, which controls read/write cache 422.

Figure 6D:
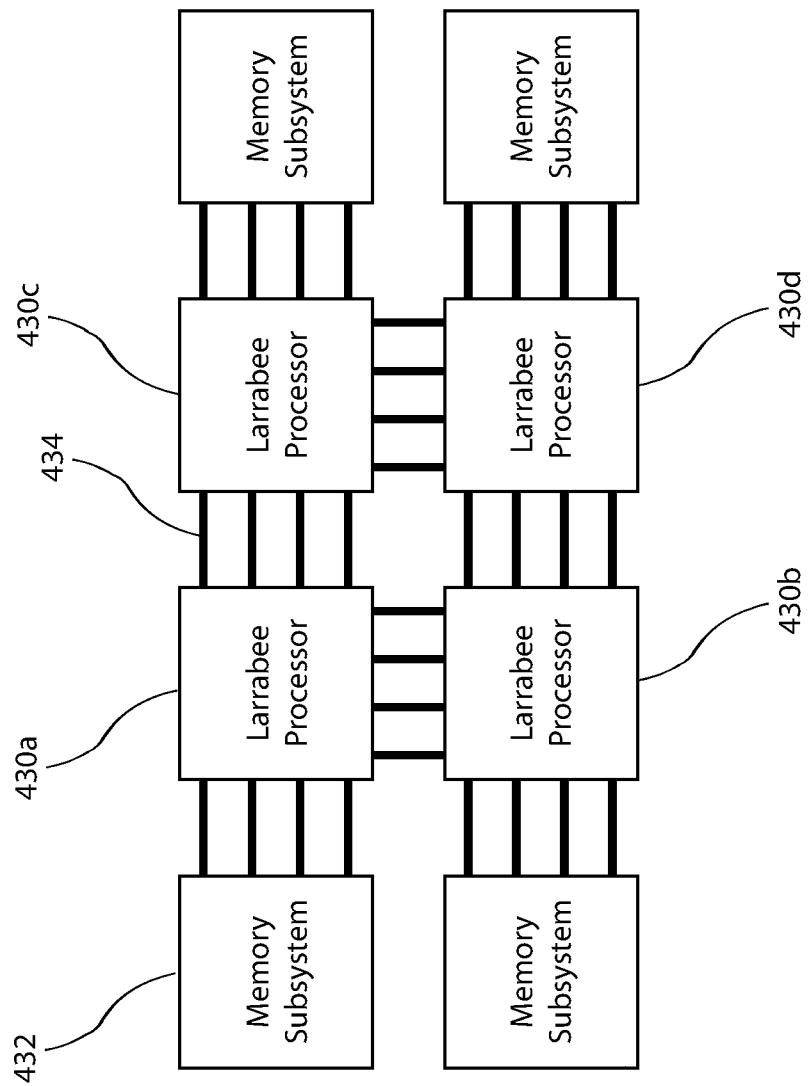

FIG. 6d illustrates the Intel Larrabee CPU architecture. The Intel Larrabee CPU includes four Larrabee processor packages 430a, 430b, 430c, and 430d where each package includes 32 processor cores. The Larrabee processor packages 430a, 430b, 430c, and 430d are interconnected using multiple common serial interconnect (CSI) busses 434. Each Larrabee package 430 has access to a connected memory subsystem 432. The compression described herein may be integrated into the CSI bus hardware.

Figure 6E:
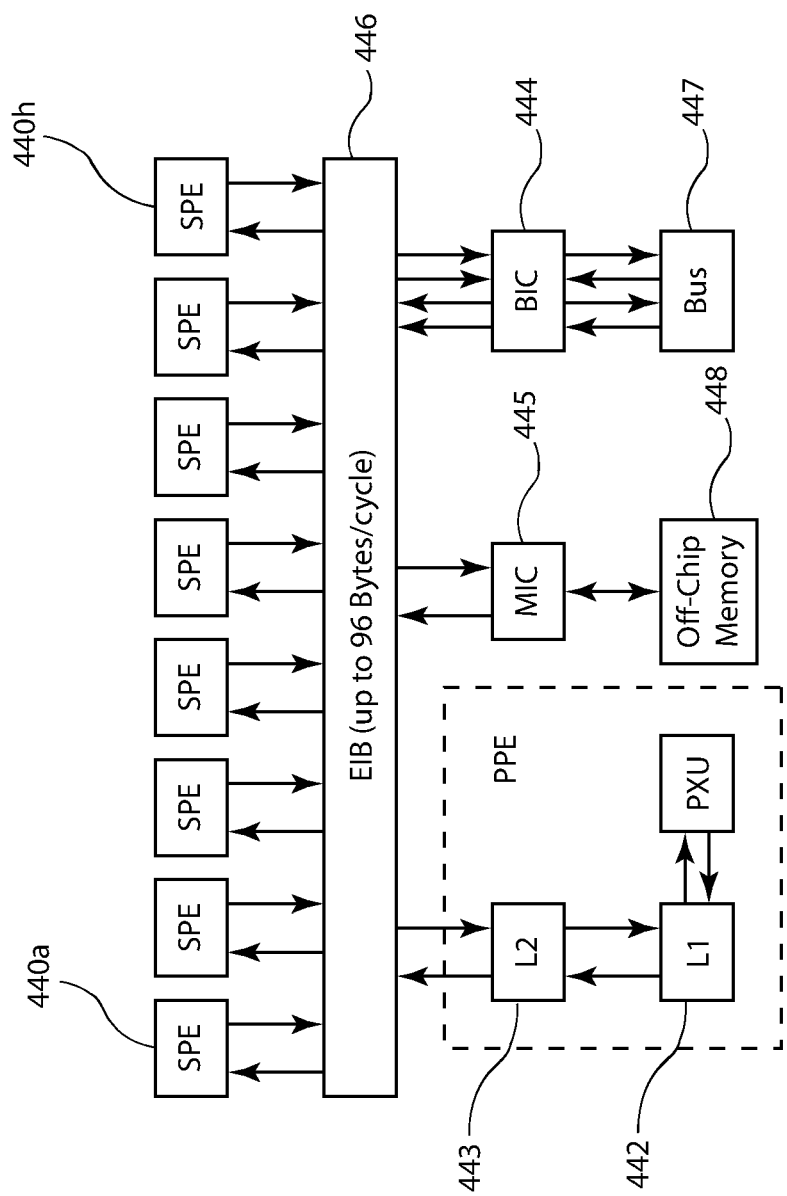

FIG. 6e illustrates the IBM Cell Broadband Engine (CBE) architecture. The IBM Cell Broadband Engine includes eight Synergistic Processor Elements (SPEs) 440a through 440h that communicate using an Element Interconnect Bus (EIB) 446. A PowerPC Processor Element (PPE) includes an L1 cache 442 and L2 cache 443 that can be accessed by the SPEs 440a through 440h via EIB 446. The IBM Cell performs off-chip bus access to bus 447 using a bus interface controller (BIC) 444, such as a FlexIO BIC. The memory interface controller (MIC) 445 controls data transfers to the off-chip memory 448. The compression described herein may be integrated into controllers for the EIB 446, MIC 445, and the BIC 444.

Figure 7A:
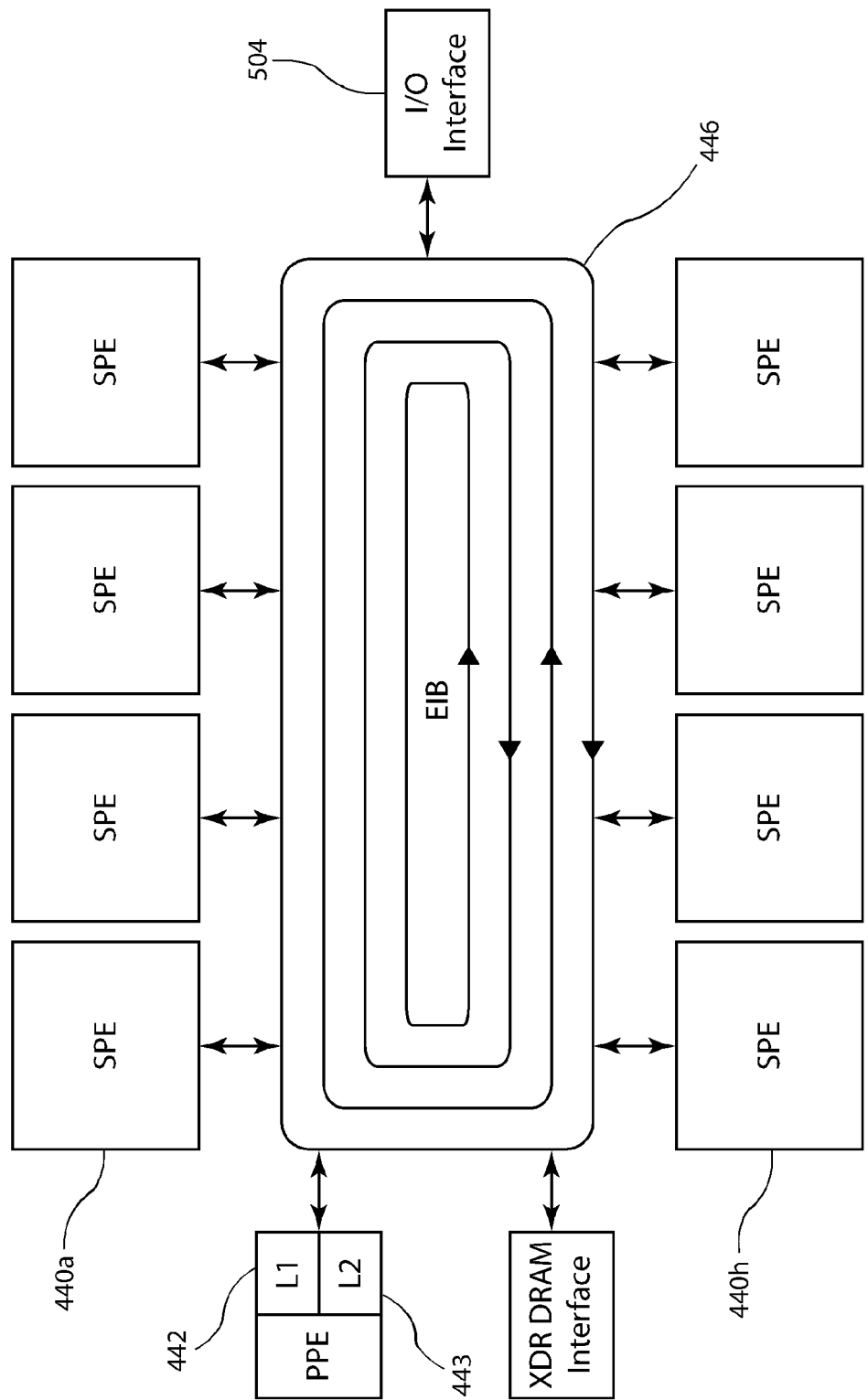
FIGS. 7a-7c illustrate network-on-chip (NoC) fabrics suitable for carrying uncompressed or compressed waveform data between processing elements.

FIG. 7 illustrates examples of three commercial network-on-chip (NoC) interconnections. NoCs are used to interconnect two or more processors on one semiconductor die. FIG. 7a illustrates the EIB 446 of the IBM Cell Broadband Engine that was introduced in FIG. 6e. Eight SPEs 400a through 400h are each attached to EIB 446, as are L1 cache 442, L2 cache 443, and I/O interface 504. EIB 446 implements an interconnection fabric that consists of four counter-rotating rings, as shown in FIG. 7a. The EIB can transfer up to 96 Bytes per IBM Cell clock cycle, providing data read from L1 cache 442, L2 cache 443, and I/O interface 504 to the processors 400, or sourcing data provided by processors 400 to L1 cache 442, L2 cache 443, and I/O interface 504. The I/O interface 504 provides for data transfers off-chip and includes the BIC 444 (FIG. 6e). The compression described herein may be integrated into the memory controllers for accessing the EIB 446 or the controller for the I/O interface 504, or both.

Figure 7B:
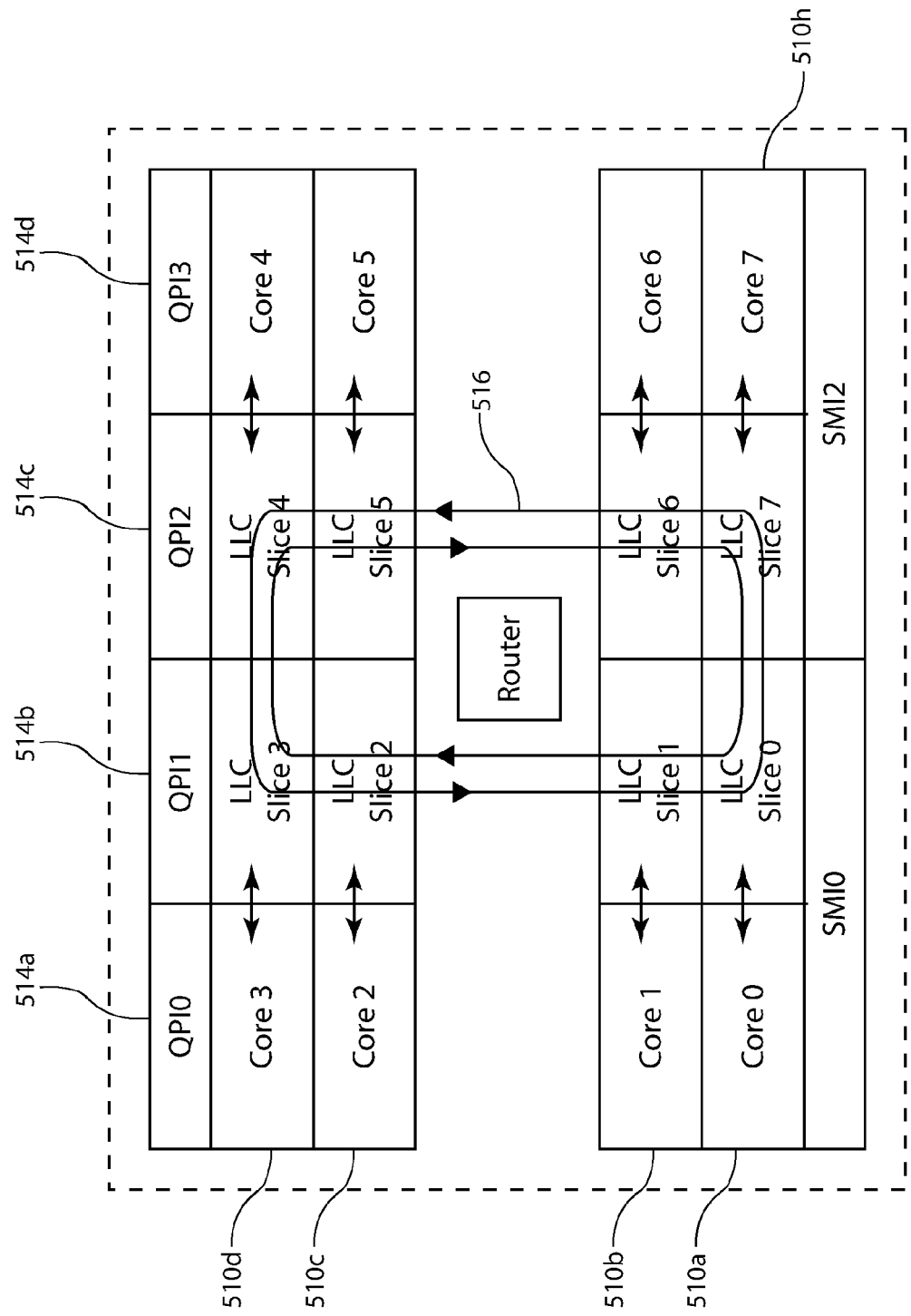

FIG. 7b illustrates an Intel Nehalem 8-processor core architecture. The 8 processors 510a through 510h are connected through two counter-rotating rings 516. Off-chip reads and writes traverse four QPI interfaces 514a through 514d. The compression described herein may be integrated into the controllers for accessing the counter-rotating ring 516 or the QPI interfaces 514 to off-chip components, or both. An integrated memory controller (not shown) controls data transfers on the scalable memory interfaces SMI0 and SMI1 to/from off-chip memory.

Figure 7C:
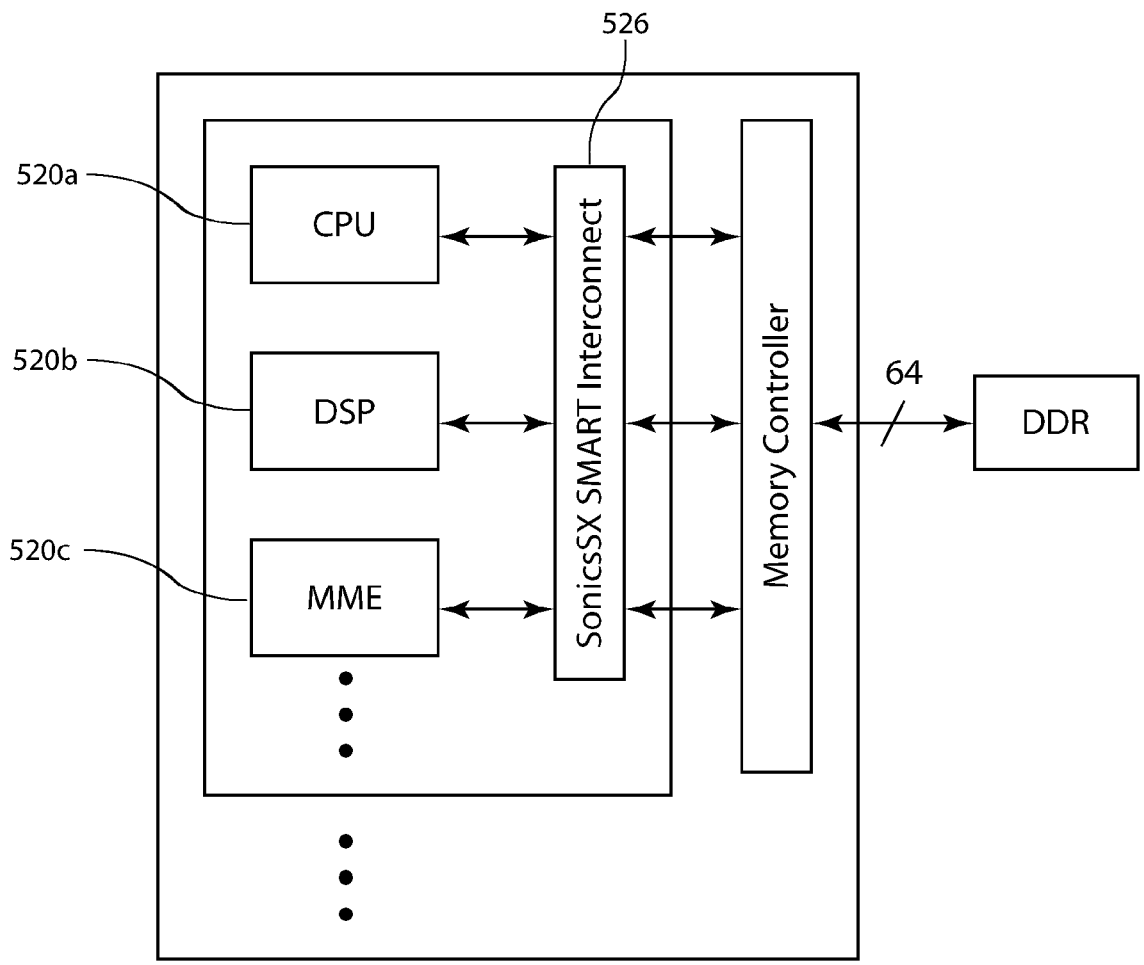

FIG. 7c illustrates a NoC fabric developed by Sonics, Inc. A SonicsMX Smart Interconnect 526 allows CPU 520a, DSP 520b, and multimedia engine (MIME) 520c to exchange data. The compression described herein may be integrated into the SonicsMX Smart Interconnect 526.

FIG. 8 is a table of various multi-processor configurations, the distance between the processors, and the memory type most commonly used to facilitate communication between processors in that configuration. In general, data exchange using packet-based protocols is implemented more often as the distance between processors increases. Data exchange between two processors that are found on the same semiconductor die, or in the same multi-die package or multi-chip module (MCM), is usually performed using shared L1 cache, shared L2 cache, or network-on-chip interfaces. On-die or on-chip processors are usually separated by at most a few mm. When two processors are located in separate chips that are separated by mm to cm, cache, FIFO, or RAM can be used by the processors to exchange data values. As of 2009, high-speed IC interconnects such as QPI, HyperTransport, Infiniband, and CSI can be used to share a distributed cache. However, it is more common that a FIFO or RAM is used to exchange data between processors that are separated by cm. When the distance between processors rises to meters (m) or kilometers (km), most commercial interconnects use some form of packet-based exchange. Packet-based communications is also used for short-distance communication between cores, as evidenced by the QPI and HyperTransport protocols, which implement exchange of cache memory data between processors separated by less than 1 mm.

Figure 9:
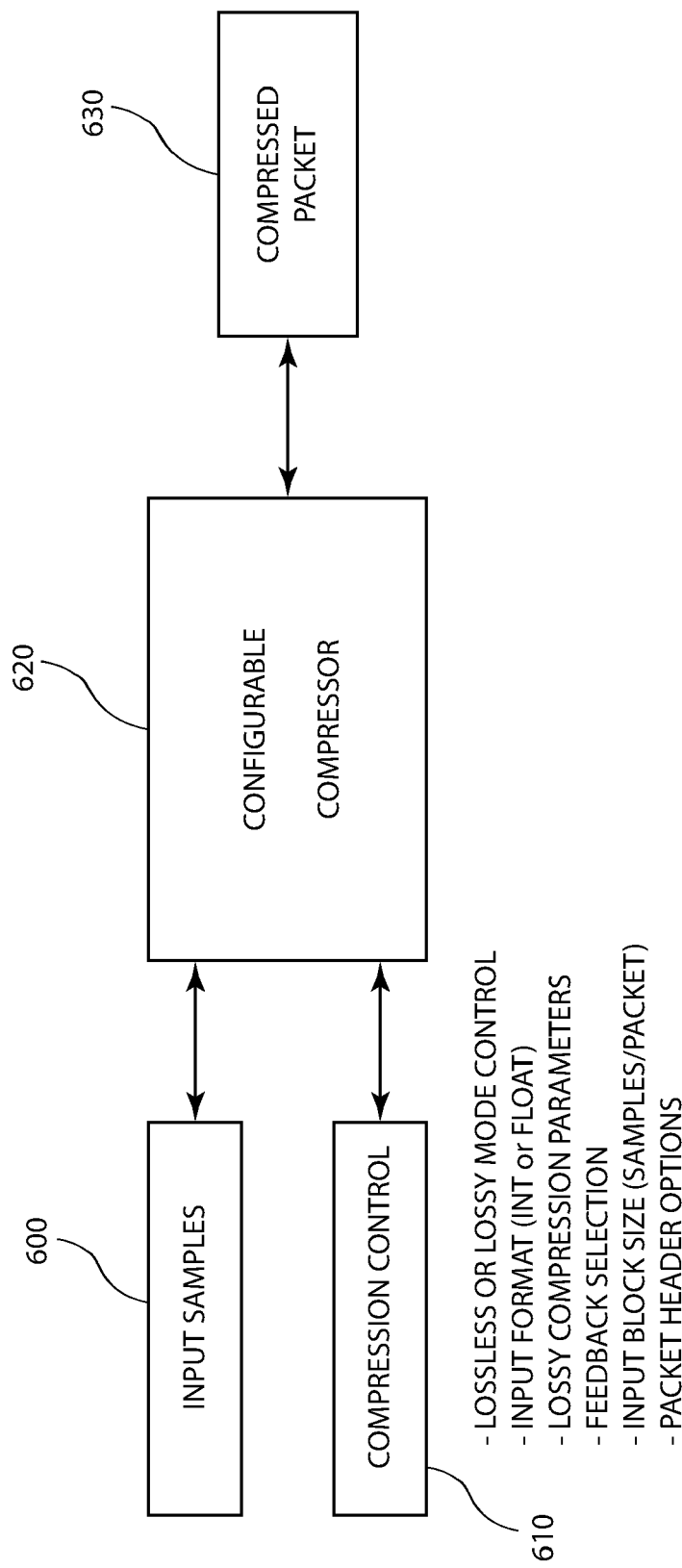
FIG. 9 illustrates the primary system components of the present invention, which in combination are suitable for compressing waveform data that is shared between multiple cores in a waveform data processing application.

FIG. 9 is a block diagram of compression of waveform data samples to form compressed packets, in accordance with a preferred embodiment. A sequence of input samples 600 is compressed by a configurable compressor 620, generating a compressed packet 630. The input samples 600 may represent digitized waveform data 125*a*, simulated digital waveform data 125*b* or intermediate digital results 150. The input samples 600 may have an integer format or floating-point format. In typical programmable processing cores or CPUs, the data format may be specified in the program. When the program does not specify the data format, the processor core uses a default data format. A compression control interface 610 provides control parameters to the configurable compressor 620 for operation in various modes. For example, the control parameters may select integer or floating-point compression mode and lossless or lossy compression mode. When lossy compression mode is selected, compression control interface 610 may include additional control parameters for fixed-rate compression or fixed-quality compression. For example in fixed-rate compression, the control parameter may represent the desired compression ratio between the size of the input data blocks and the size of the payload portion of the compressed packet 630. For example in fixed-quality compression, the compression parameter may represent the signal-to-noise ratio of the values that result after compressed packet 630 is decompressed. When the configurable compressor 620 is adaptable to process different-size blocks of input samples 600 (i.e. groups of consecutive samples), the compression control interface 610 may specify the input block size by a control parameter. When the compressed packet 630 includes a header, the compression control interface 610 may specify what parameters are included in the packet header, such as the compressed block size or an error-correcting code (ECC). A single configurable compressor 620 is adaptable to process both integers and floating-point values.

Figure 10:
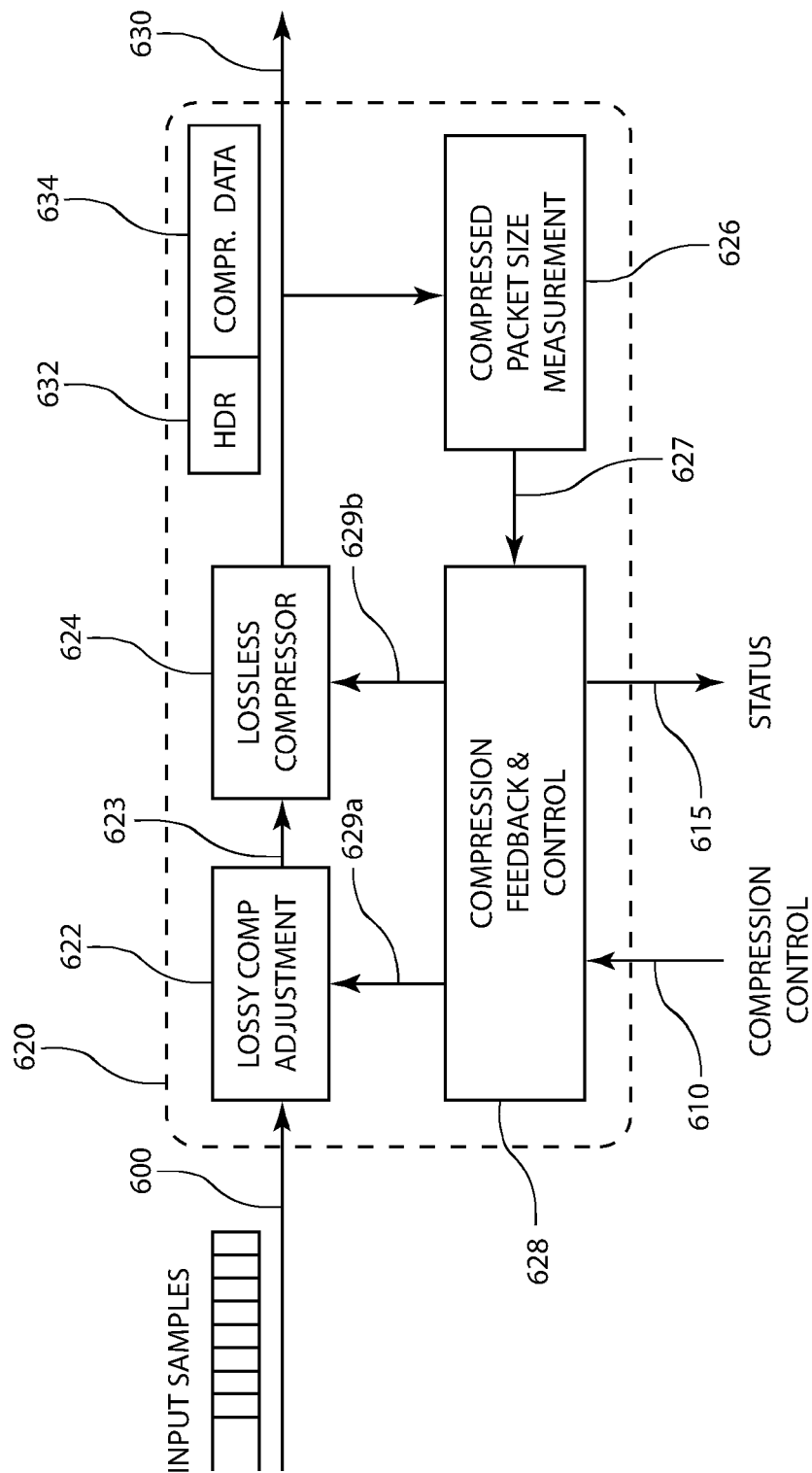
FIG. 10 illustrates a compressor suitable for compressing integer waveform data.

FIG. 10 is a block diagram of the configurable compressor 620 when compressing integer values. For lossy compression, a lossy compression adjustment processor 622 operates on the input samples 600 to form adjusted input samples 623. For lossless compression, the lossy compression adjustment processor 622 is either bypassed or set to "no adjustment" and the adjusted input samples 623 have the same values as the input samples 600. The lossy compression adjustment processor 622 is controlled by a compression and feedback control block 628, via adjustment control signal 629*a*. The degree of loss introduced by lossy compression adjustment processor 622 may be selected by a user via compression control interface 610. Alternatively, the degree of loss may be automatically adjusted based on a feedback parameter. For example, for a fixed-rate compression mode, compressed packet size measurement block 626 calculates the compressed packet size 627. The compression feedback block 628 compares the compressed packet size 627 to a desired packet size to determine the feedback parameter for the adjustment control signal 629*a*. The user may select the desired packet size via compression control interface 610. Compressed packet size measurement block 626 may provide the measured packet size 627 on a packet-by-packet basis, or it may provide an averaged measured packet size 627 over a selectable number of output packets. The lossless compressor 624 compresses the adjusted input samples 623 in accordance with compression control signal 629*b*.

Commonly owned patents and applications describe a variety of compression techniques that may be used in lossless compressor 624 and the lossy compression adjustment processor 622. These include U.S. Pat. No. 7,009,533 ("the '533 patent"), entitled "Adaptive Compression and Decompression of Bandlimited Signals" by Wegener, issued Mar. 7, 2006 incorporated herein by reference, and U.S. Pat. No. 5,839,100 ("the '100 patent"), entitled "Lossless and loss-limited Compression of Sampled Data Signals" by Wegener, issued Nov. 17, 1998 incorporated herein by reference, and the U.S. patent application Ser. No. 12/605,245, entitled "Block Floating Point Compression of Signal Data" ("the BFP compression application") by Wegener, filed Oct. 23, 2009 incorporated herein by reference.

The compression techniques include differential encoding by calculating of one or more derivatives of adjusted input samples 623, block floating-point bit packing, Huffman encoding, and other lossless compression techniques that may be implement the lossless compressor 624. Lossless compressor 624 may generate compressed packets 630, which may include a header 632 and a compressed payload 634. The header 632 may contain one or more compression control parameters that are provided by the compression and feedback control block 628. The header 632 may contain a parameter that indicates the data type of the compressed samples contained in the compressed packet, such as integers or floating-point values, as well as the values control parameters such as the adjustment control signal 629*a* and the compression control signal 629*b*. The compression and feedback control block 628 may generate a compression status signal 615 that may indicate various compression statistics, such as average or instantaneous compression ratio, adjustment control signal 629*a*, compression control signal 629*b*, or internal warning or error conditions in configurable compressor 620.

Figure 11:
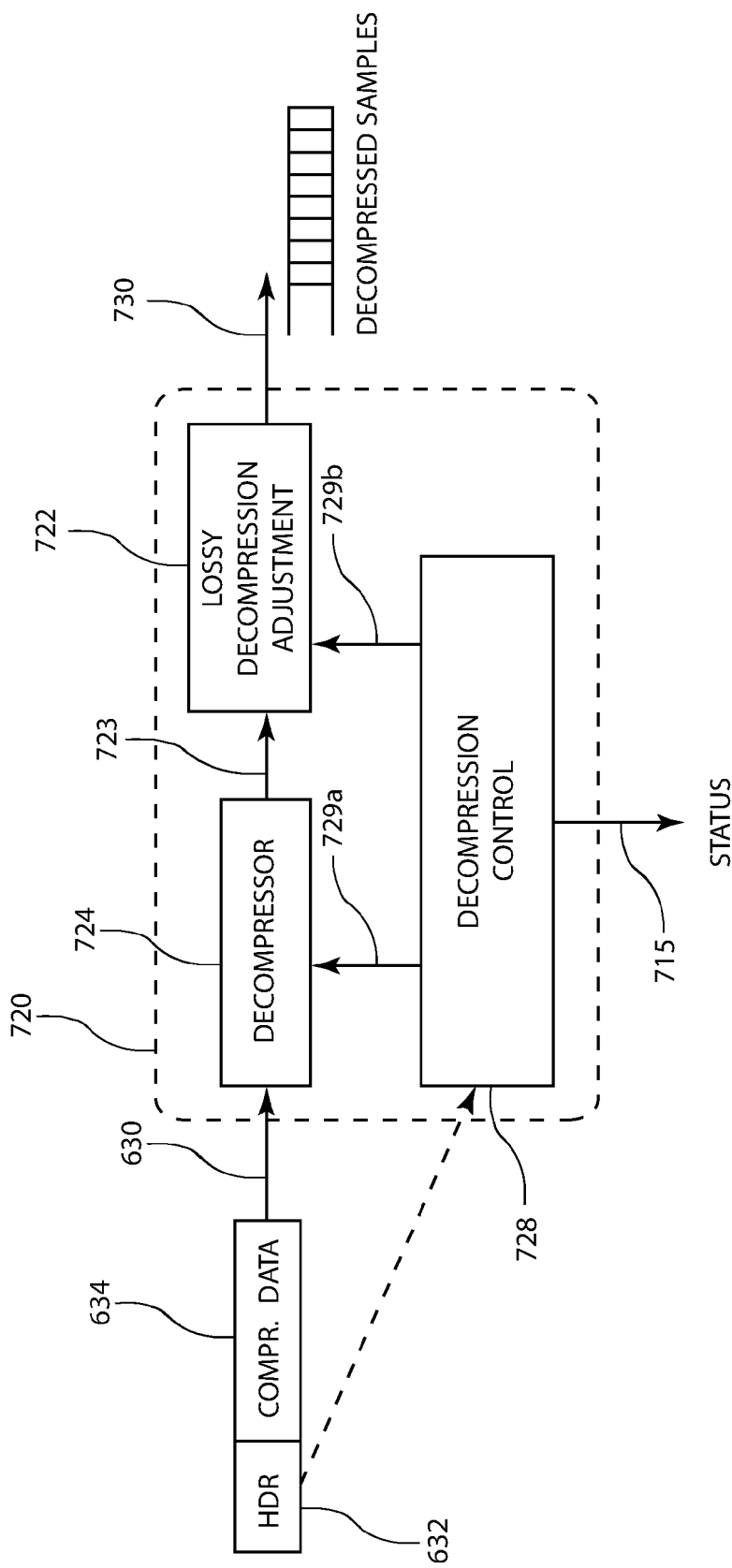
FIG. 11 illustrates a decompressor suitable for decompressing compressed integer waveform data.

FIG. 11 is a block diagram of decompression of the compressed integer data. The configurable decompressor 720 receives the compressed packets 630. The decompression control block 728 examines the contents of compressed packet header 632 and decodes any control parameters for the decompressor 724 and lossy compression adjustment block 722. The decompressor 724 performs operations under the control of decompression control signal 729*a* that un-do the compression operations performed by lossy compressor 624 of FIG. 10, thereby reconstructing the adjustment input signal 723. Lossy decompression adjustment block 722 performs operations that un-do the adjustment operations performed by lossy compression adjustment block 622 of FIG. 10, under the control of decompression adjustment signal 729*b*. Decompressed signal 730 represents the output samples of configurable decompressor 720. Decompression control block 728 may also optionally generate status signal 715, which may include the average or instantaneous compression ratio, decompression control signal 729*a*, decompression adjustment signal 729*b*, or internal warning or error signals from decompressor 720.

Figure 12:
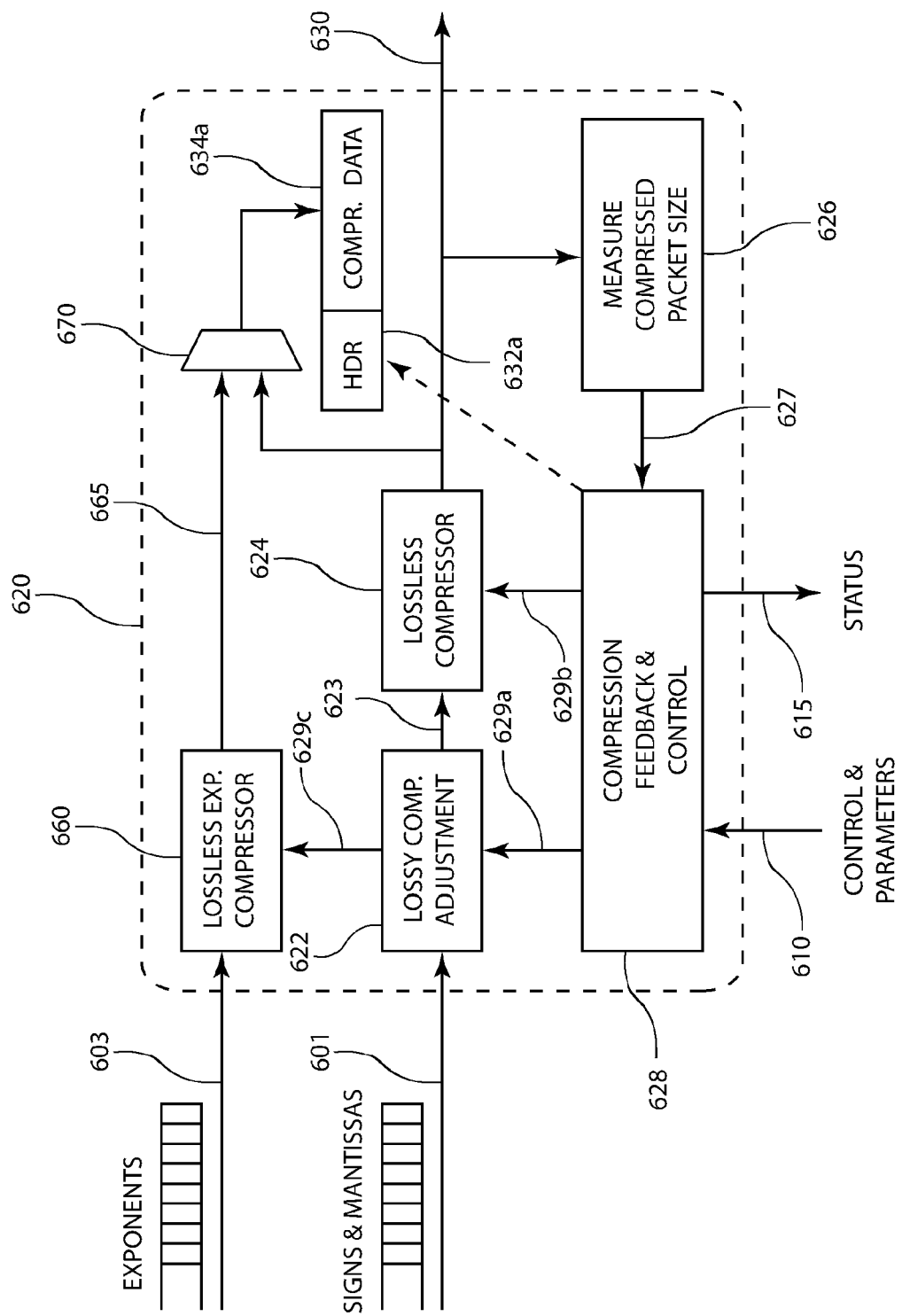
FIG. 12 illustrates a compressor suitable for compressing floating-point waveform data.

FIG. 12 is a block diagram of the configurable compressor 620 configured to compress floating-point data. Floating-point data representations consist of three fields: a sign bit, an exponent, and a significand (mantissa). A format preprocessor (not shown) separates the exponent from the sign and significand of each the floating-point input sample to provide the input exponents 603. The format preprocessor combines the sign bit and significand to form sign and mantissa input samples 601. The configurable compressor 620 processes the sign and mantissa input samples 601 in the same manner that integer samples 600 were processed by configurable compressor 620 described with respect to FIG. 10. In addition, the configurable compressor 620 applies the lossless exponent compressor 660 and compressed payload multiplexer 670 to the input exponents 603. Lossless exponent compressor 660 compresses the exponents 603 in a lossless manner under the control of lossless exponent compression control signal 629*c* from compression and feedback control block 628. The lossless exponent compressor 660 may apply one or more of the techniques described the '533 patent, the '100 patent and the BFP compression application. Compression control signal 629c may provide control parameters specifying the compression method applied to exponents 603, such as block floating-point encoding, differential encoding, Huffman encoding, or other compression techniques suitable for compressing exponents 603. Compressed payload multiplexer 670 controls the location of compressed exponent bits 665 and compressed sign and mantissa bits 631 in compressed packet payload 634a. Compressed payload multiplexer 670 may be controlled by compression and feedback control block 628, as described with respect to FIG. 10.

The configurable compressor 620 shown in FIG. 12 can be applied to integer or floating-point waveform data values. When integer samples are compressed, exponent compressor 660 and compressed payload multiplexer 670 are not used, and the integer samples provide the sign and mantissa input samples 601, analogous to the input samples 600 in FIG. 10. When floating-point samples are compressed, the floating-point exponent values are the exponents 603, the floating-point sign and mantissa values are the sign and mantissa input samples 601. The format pre-processor is applied to the input samples 600 to provide the exponents 603 and the sign and mantissa samples 601. The format preprocessor provides a common format for the floating-point signs and mantissas extracted from floating-point data and the integer data so that the lossy compression adjustment block 622 and the lossless compressor 624 receive data in the same format, regardless of whether the input samples 100 are represented by integers or floating-point values. In this manner, configurable compressor 620 can be configured to compress either integer or floating-point waveform data values in accordance with the various control signals from compression and feedback control block 628.

Figure 13:
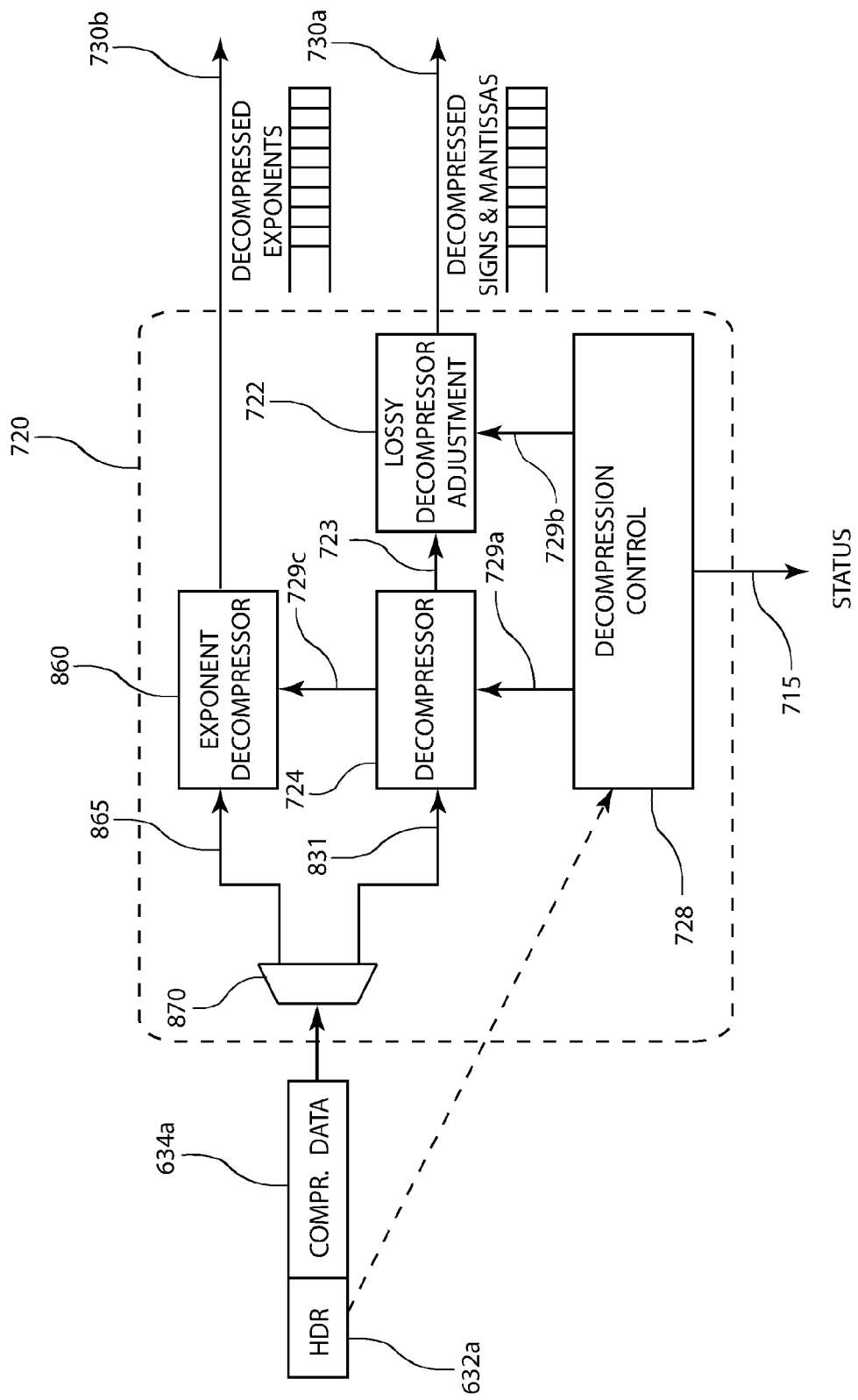
FIG. 13 illustrates a decompressor suitable for decompressing compressed floating-point waveform data.

FIG. 13 is a block diagram of a configurable decompressor 720 for decompressing compressed floating-point data. The configurable decompressor 720 receives the compressed packet including compressed floating-point data as the compressed payload 634a. The decompressor 724 and the lossy decompression adjustment block 722 apply the same decompression operations to the compressed sign and mantissa data as the respective elements described with respect to FIG. 11. The configurable decompressor 720 includes a payload demultiplexer 870 and an exponent decompressor 860 for processing the compressed exponent data. After examining compressed packet header 632a, decompression controller 728 provides control parameters to the payload demultiplexer 870, decompressor 724, lossy decompression adjustment block 722 and exponent decompressor 860. The payload demultiplexer 870 separates the compressed payload 634a into compressed exponent bits 865 and compressed sign and mantissa bits 831. The demultiplexed, compressed sign and mantissa bits 831 are decompressed and adjusted as described for compressed integer data (FIG. 11). The exponent decompressor 860 decompresses the compressed exponent bits 865 in accordance with any control parameters provided by the exponent decompressor control signal 729c. Exponent decompressor 720 generates decompressed exponents 730b. The decompressor 724 and lossy decompression adjustment block 722 generate decompressed sign and mantissa samples 730a. A data formatter (not shown) may combine the decompressed exponents 730b and the corresponding decompressed sign and mantissa samples 730a into a sequence of decompressed samples having the same floating-point format as the original input samples 600. Alternatively, the data formatter may provide a format conversion of the decompressed exponents 730b and the corresponding decompressed sign and mantissa samples 730a to produce decompressed samples having a different data format than the original samples. Depending on the settings of the various decompression and adjustment control signals generated by decompression control block 728, under the optional control of header parameters in compressed packet header 632a, the configurable decompressor 720 can generate decompressed integer waveform data values or decompressed floating-point waveform data values.

A preferred embodiment of the lossless compressor 624 applies lossless differential encoding followed by block floating-point bit packing. Techniques for lossless differential encoding are described in the '533 patent and the '100 patent. Techniques for block floating-point bit packing are described in the BFP application. Applying differential encoding followed by block floating-point bit packing implements a low-latency compressor that is desirable for packet-based waveform data compression. A preferred embodiment of the lossy compression adjustment block 622 reduces the magnitudes of the input samples 600 to provide controllable amounts of loss. The lossy compression adjustment block reduces the sample magnitudes by applying a bit shifter and a multiplier to the input samples 600. The bit shifter and multiplier combination achieves a desired goal of low complexity.

In a preferred embodiment for the configurable decompressor 720, the decompression controller 728 decodes control parameters contained in compressed packet header 632 to provide the respective control signals 729a, 729b and 729c for decompression. A preferred embodiment of the header 632 or 632a of the compressed packet includes an indicator of data type (integer or floating-point data), as well as adjustment and compression control parameters. Compressed packet header 632 may optionally also include control parameters that apply to the entire compressed payload for that packet, including the number of mantissa bits that were preserved during compression.

Figure 14A:
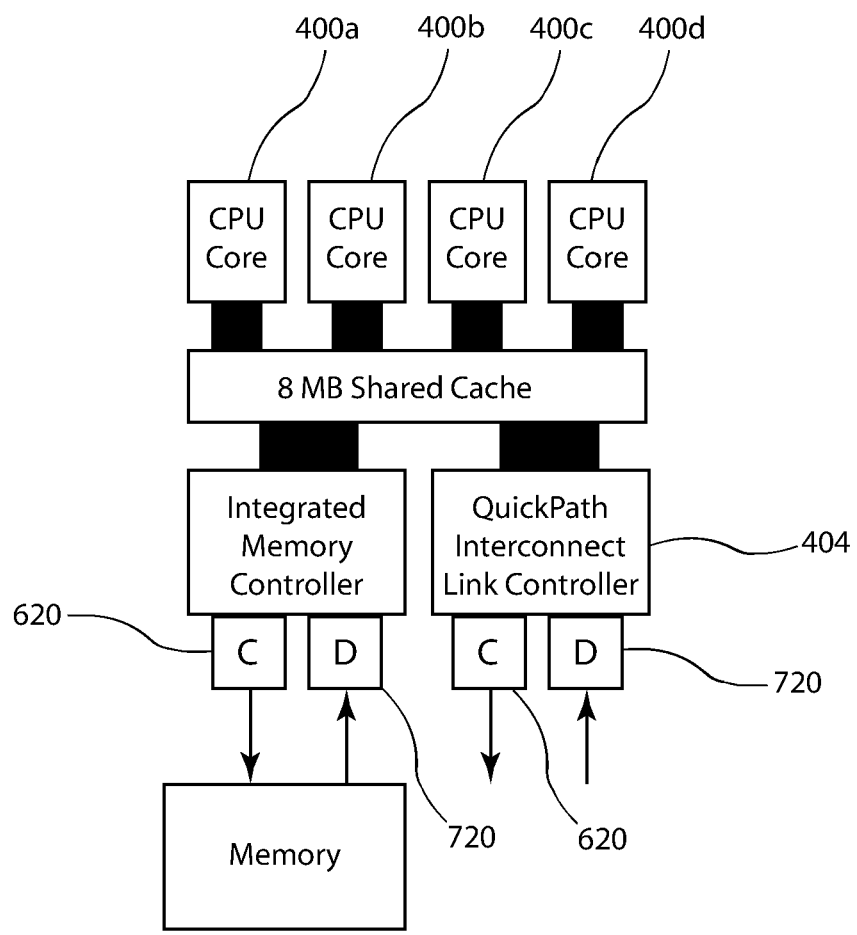
FIGS. 14a-14c illustrate

FIG. 14 illustrates examples of locations for the configurable compressor 620 and the configurable decompressor 720 in the multi-core processors described with respect to FIGS. 6a, 6e and 7b. FIG. 14a illustrates the integration of compression and decompression in the Intel Nehalem CPU architecture of FIG. 6a. The configurable compressor 620 and the configurable decompressor 720 can be integrated at each QPI interface 404 to compress data for the payloads of the QPI packets to be transmitted and to decompress the compressed data from the payloads of the received QPI packets. An off-chip input controller (not shown) for providing waveform data for the Nehalem processor compresses the input waveform data to form compressed payload data for the QPI packets. The decompressor 720 at the QPI interconnect link controller 404 decompresses the compressed payload data and provides the decompressed waveform data as payload data for QPI packets for transfer to the CPU cores 400a-d. For the Nehalem 8-processor core architecture described with respect to FIG. 7b, the QPI packets containing the decompressed payload data are transferred to the processor cores 510a to 510h via the counter-rotating rings 516. The Nehalem architecture is an example of on-chip communication using the same packet protocol as for data transfer to/from off-chip components. The integrated memory controller may also include configurable compressor 620 and decompressor 720 to compress waveform data provided to off-chip memory and decompress compressed waveform data retrieved from memory.

Figure 14B:
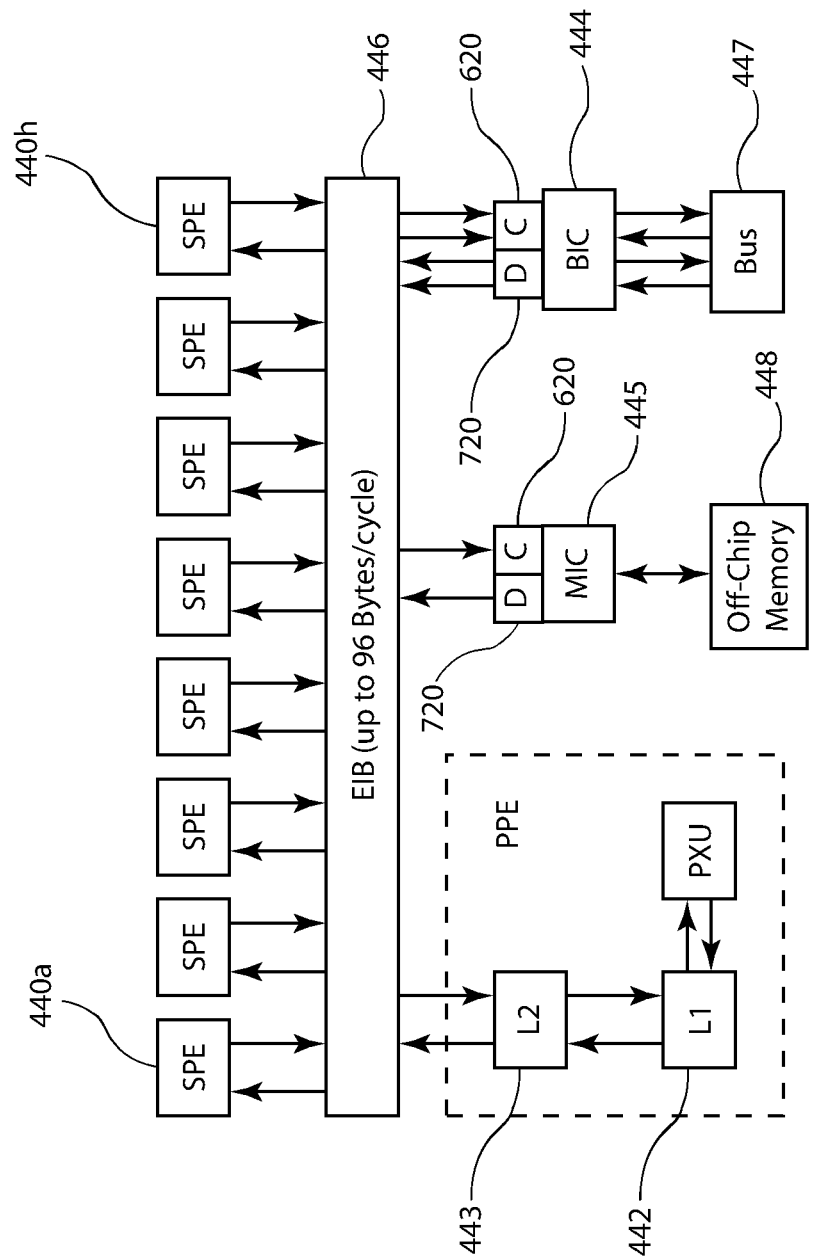

FIG. 14b illustrates the integration of compression and decompression in the IBM Cell Broadband Engine architecture of FIG. 6e. The bus interface controller (BIC) 444 controls off-chip communications. The configurable compressor 620 and the configurable decompressor 720 can be integrated at the BIC 444, to compress waveform data for transmitted packets and to decompress received compressed packets. For providing input data to the multiple SPEs 440a through 440h, an off-chip controller (not shown) includes a compressor that compresses the waveform data to form compressed payload data for the bus packets received at BIC 444. The configurable decompressor 720 at BIC 444 decompresses the compressed payload data to form decompressed waveform data provided to the EIB 446 for transfer to the SPEs 440a through 440h. The configurable decompressor 720 may insert decompressed waveform data into packets having the protocol compatible for the EIB 446. The IBM Cell architecture is an example of on-chip communication using a different packet protocol than for data transfers off-chip. For transfer of processed waveform data off-chip, the configurable compressor 620 at the interface with BIC 444 compresses the processed waveform data transferred from the SPEs 440a-h via the EIB 446 to form compressed payload data for transmission across external bus 447. An off-chip controller at a destination device (not shown) includes a decompressor that extracts and decompresses the compressed payload data from the received bus packets to reconstruct the processed waveform data. The configurable compressor 620 and decompressor 720 may be integrated with the memory interface controller (MIC) 445 to provide compressed data transfers to/from off-chip memory 448. The configurable compressor 620 and decompressor 720 may also be implemented separately from, or shared by, MIC 445 and BIC 444.

Figure 14C:
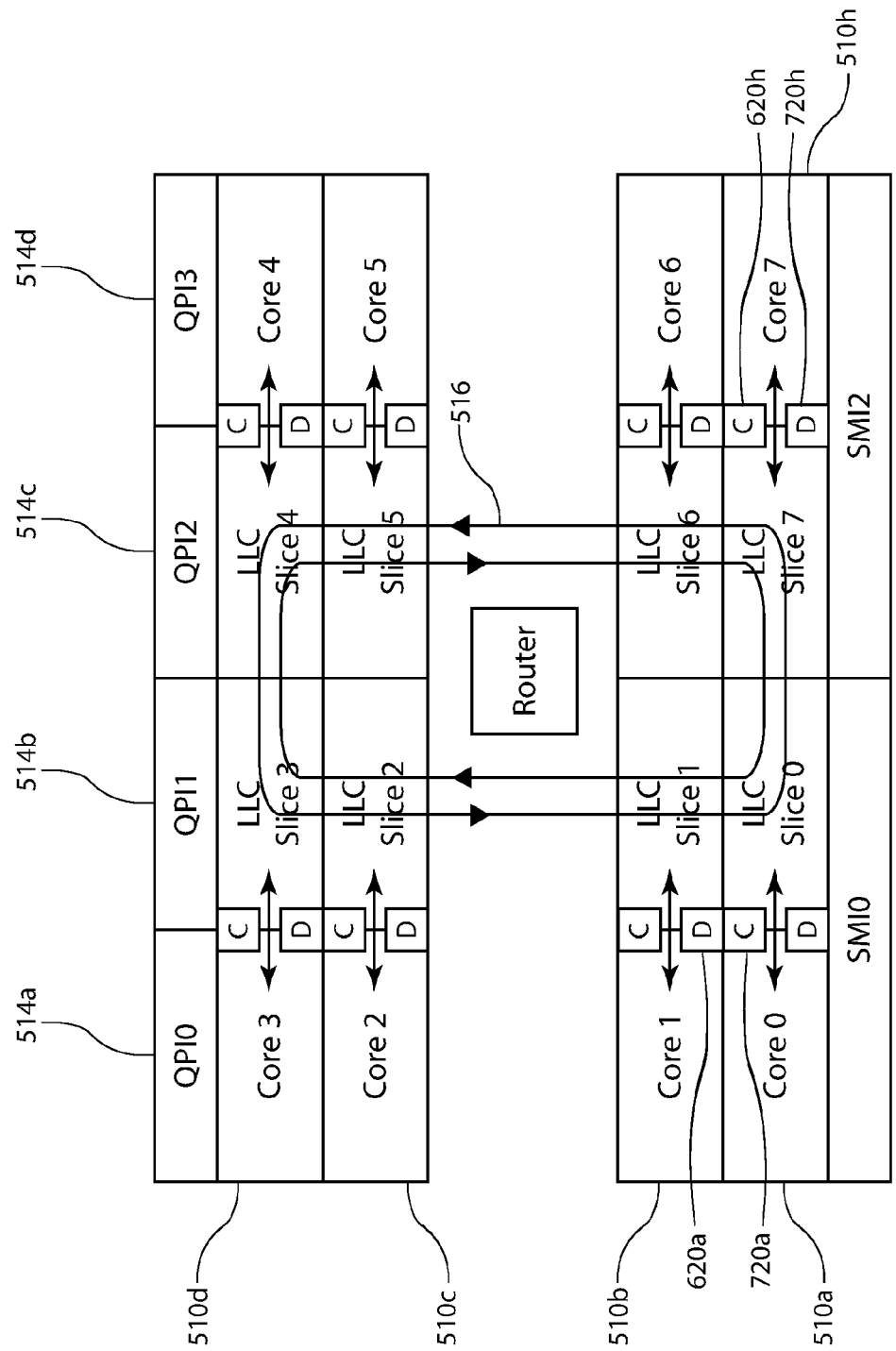

FIG. 14c illustrates an example of compression and decompression for communication among the processor cores of the Intel Nehalem (FIG. 7b). The eight processor cores 510a-h transfer data via two counter-rotating rings 516. The counter-rotating rings 516 transfer packets using the QPI packet protocol. The processor cores 510a-h include respective configurable compressors 620a-h that compress waveform data for transfer to one or more other cores 510a-h. The waveform data to be transferred may be intermediate data of the application processing. The configurable compressors 620a-h form QPI packets where the payload portions contain the compressed data. The configurable compressors 620a-h provide the QPI packets with compressed payloads via the counter-rotating rings 516 to one or more of the other cores 510a-h. For receiving data from the counter-rotating rings 516, the respective configurable decompressors 720a-h decompress the compressed payloads of the received QPI packets to reconstruct the intermediate data or waveform data for further processing by the respective cores 510a-h. In addition to the communication among processor cores, configurable compressor 620 and decompressor 720 may also be integrated into the controllers at QPI interfaces 514a-d and/or memory interfaces SMI0 and SMI1.

Figure 15:
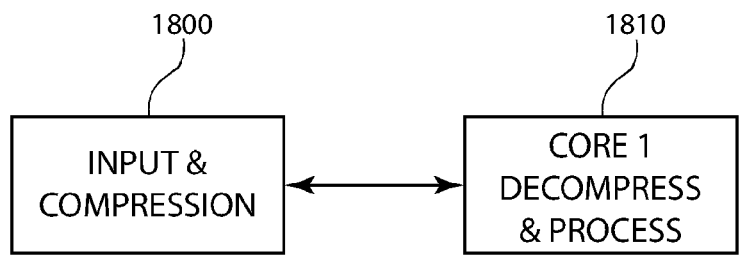
FIG. 15 is an example of providing input data to a processor core.

FIG. 15 is an example of providing input data to a processor core. The input controller 1800 may be connected to a device generating input data, such as an ADC 120 providing sampled waveform data, a simulator 130 providing simulated waveform data or an external processor providing intermediate digital results 150 (see FIG. 2). The input controller 1800 compresses the input data prior to transfer to the processor core 1810. The processor core 1810 applies decompression to the received input data prior to performing the operations of the particular application. The input controller 1800 may distribute compressed data to multiple processor cores (not shown in FIG. 15), each of which would decompress received data to form decompressed data for the application processing.

Figure 16:
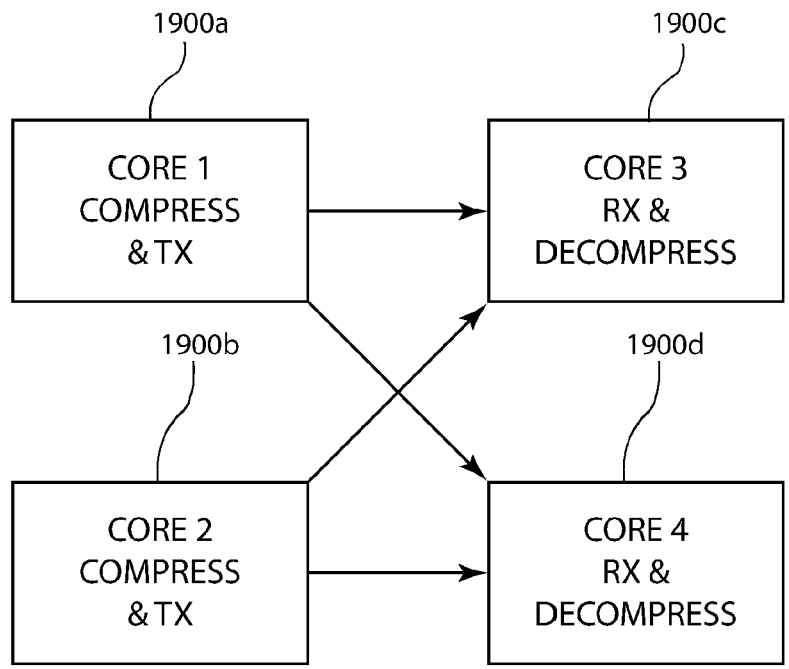
FIG. 16 is an example of communicating data among multiple processor cores.

FIG. 16 is an example of communicating data among multiple processor cores. The source processor cores 1900a and 1900b are providing partially processed data or intermediate results to each of the destination processor cores 1900c and 1900d for further processing in an application. The source cores 1900a,b compress the respective partially processed data, or intermediate results, and transfer the respective compressed data. The destination cores 1900c,d each receive and decompress the compressed data from both of the source cores 1900a,b. The destination cores 1900c,d apply respective processing operations to the decompressed data.

Figure 17:
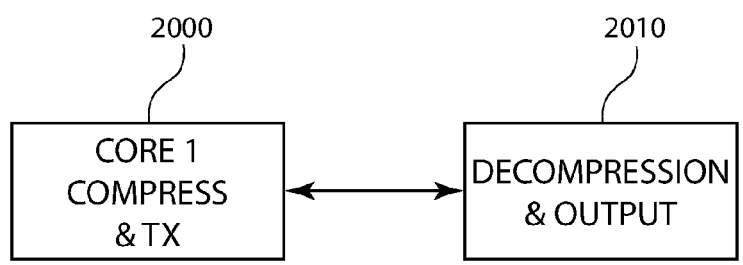
FIG. 17 is an example data transfer from a processor core to an output controller.

FIG. 17 is an example data transfer from a processor core to an output controller. The processor core 2000 produces processed waveform data for the particular application. The processed waveform data may represent partially processed intermediate results or fully processed final results for the application. The processor core 2000 compresses the processed data and transfers the compressed data to the output controller 2010. The output controller 2010 receives and decompresses the compressed data. Multiple processor cores (not shown) may compress and transfer processed data to the output controller 2010. The output controller 2010 may perform additional functions on the decompressed data, such as aggregating the data received from the different processor cores for further processing or display.

Figure 18:
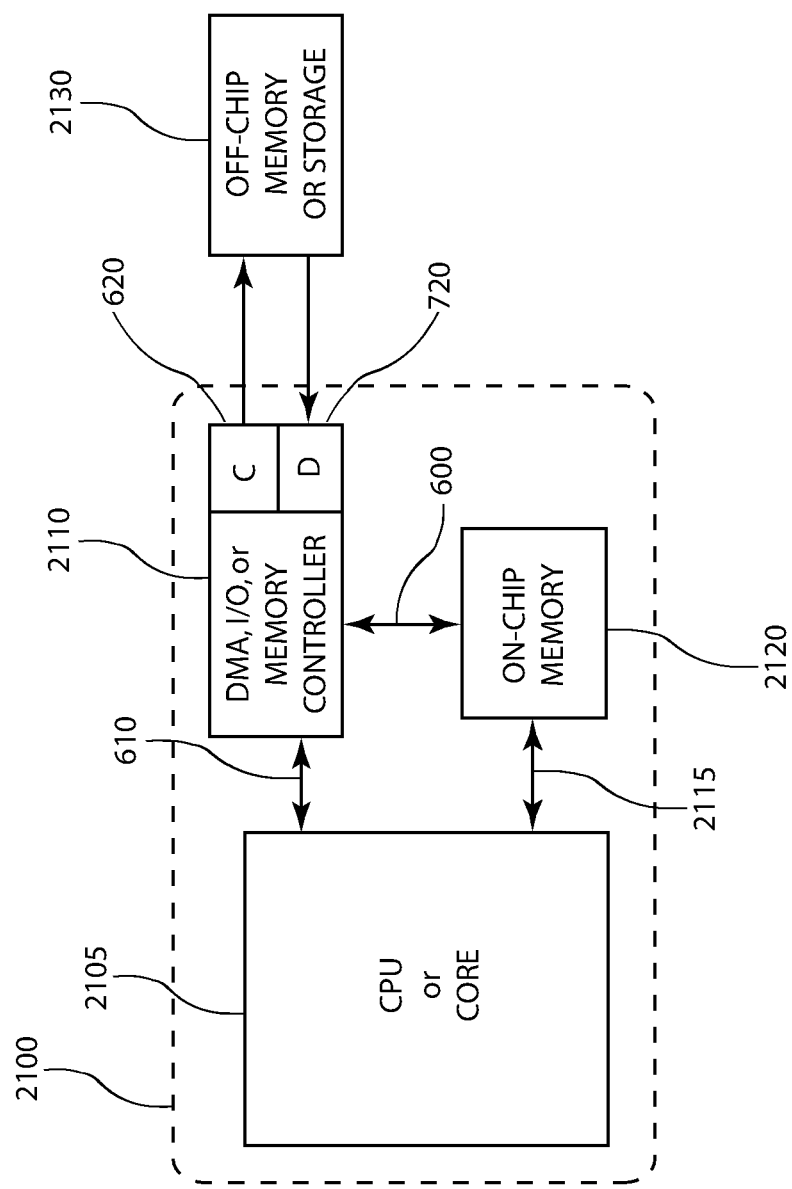
FIG. 18 illustrates an enhanced DMA, input-output, or memory controller using compression and decompression for off-chip memory access.

FIG. 18 illustrates a processor 2100 whose read and write access to an off-chip memory or storage device 2130 is improved using compression and decompression. CPU or core 2105 accesses both on-chip memory 2120 and off-chip memory or storage device 2130. CPU or core 2105 accesses to on-chip memory 2120 are performed directly via address and data bus 2115. CPU or core 2105 requests compressed accesses (reads or writes) to off-chip memory or storage 2130 via direct memory access (DMA), input-output, or memory controller 2110, via compression control interface 610. As previously described with FIG. 9, compression control interface 610 allows CPU or core 2105 to provide control parameters for the configurable compressor 620 to compress integer or floating-point data, to compress in a lossless or lossy mode, to specify desired compressed block size, and other compression-specific parameters during data writes to off-chip memory or storage device 2130. The configurable compressor 620 may include the control information in the headers of compressed packets stored in off-chip memory or storage device 2130. During data reads from off-chip memory or storage device 2130, the configurable decompressor 720 decodes control information in each compressed packet header decompresses integer or floating-point values using decompression operations in accordance with the control parameters. The decompressed output samples are provided to on-chip memory 2120. The configurable compressor 620 is especially suitable for the block or packet-based nature of accesses to off-chip memory or storage 2130. When element 2110 is implemented as a DMA controller, large blocks of data are typically transferred between on-chip memory 2120 and off-chip memory or storage device 2130. Because the present invention is applicable for compression and decompression of packet-based or stream processing (in contrast to random-access, single-value processing), the configurable compressor 620 and the configurable decompressor 720 are well-suited to DMA accesses. Also, since CPU or core 2105 typically initiates DMA accesses via DMA controller 2110, the latency introduced by the configurable compressor 620 during data writes, or by the configurable decompressor 720 during data reads from the off-chip memory or storage device 2130, can be hidden in the relatively long DMA transaction times (long when compared to CPU 2105's access to on-chip memory 2120).

FIG. 19 shows a table of the bandwidth improvements for an example of applying 2:1 compression to a 1 MB data packet. This example assumes that the 1 MB data packet contains integer or floating-point waveform values. The waveform values could contain 8-bit, 16-bit, or 32-bit values, corresponding to 1, 2, or 4 bytes per waveform sample. Similarly, the waveform values could also contain floating-point values 32-bit or 64-bit length, corresponding to 4 Bytes or 8 Bytes per floating-point waveform sample. Column 1 of FIG. 19 lists the example parameters, while Columns 2 and 3 contain the parameter values without compression and with 2:1 compression, respectively. Considering Column 2 (without compression), a 1 MB data transfer from Core 1 to Core 2 includes a start-up latency in the Core 1 transmitter (Tx) of 1 msec (0.001 sec), and a completion latency in Core 2 receiver (Rx) of 1 msec (0.001 sec). A 1 MB waveform data packet requires a total uncompressed transfer time of 1.002 sec, including 1 sec of transfer time using a 1 MB/sec link between Core 1 and Core 2 in this example. In contrast, Column 3 lists the same parameters in the case where 2:1 compression is applied to the original 1 MB waveform packet, so that only 500 kB of compressed data are transferred. Both the configurable compressor 620 and the configurable decompressor 720 have additional start-up latencies, which come from filling the compression and decompression pipelines. In this example, the compression and decompression latencies are estimated at 10 msec (0.01 sec) for each. Thus using 2:1 compression, a 1 MB waveform data packet requires a total compressed transfer time of 0.52 sec, including 0.5 sec of transfer time using a 1 MB/sec link between Core 1 and Core 2. The final row of FIG. 19 indicates that the transfer bandwidth with 2:1 compression is nearly twice as much as the uncompressed transfer bandwidth.

In multi-core applications, the computational work to be performed is distributed among multiple cores. In many waveform processing applications, either integer or floating-point data are distributed to multiple cores using a variety of network, bus, and memory interfaces. The total processing time for such applications is affected both by the time required to distribute the waveform data samples to the multiplicity of processing cores, as well as by the time required to complete the computational work in each core. Furthermore, waveform processing often requires the data to be distributed in a known sequence or order; when this is the case, some cores will spend time waiting for neighboring cores to deliver their processed waveform output results. The total time for all waveform processing applications will decrease if the I/O time is reduced, regardless of the compute time. Applications whose total time is determined more by I/O (data exchange) time than core compute time are called "I/O bound" applications. Applications whose total time is determined more by core compute time than I/O (data exchange) time are called "compute-bound" applications. The present invention is especially effective at shortening the total processing time of I/O bound applications. I/O bound applications benefit both from the present invention's increase in waveform data bandwidth and reduction in waveform data latency. The time that cores spend waiting for waveform input data is also reduced.

Figure 20:
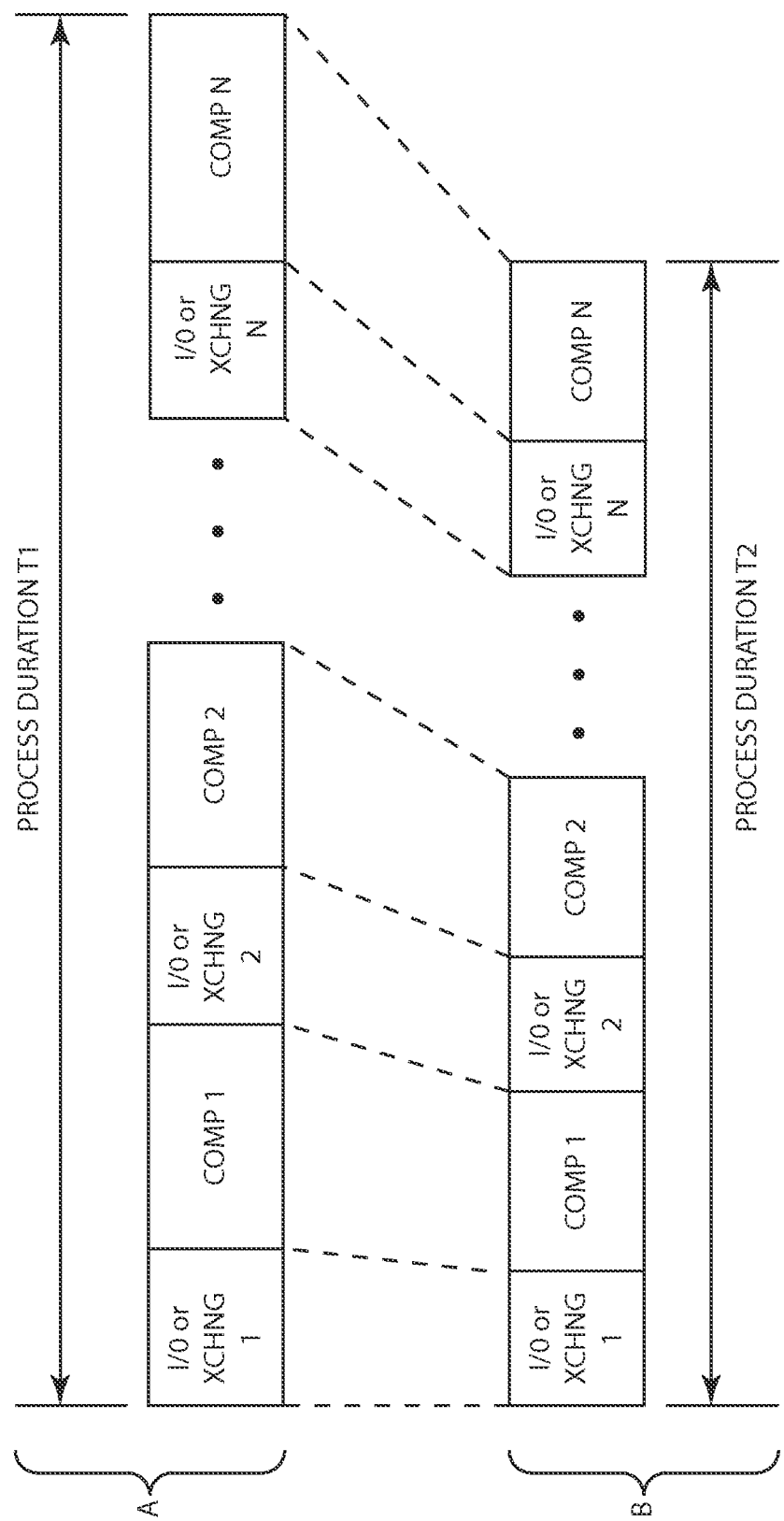
FIG. 20 illustrates the reduction of processing time as the input-output time for a multi-packet data set is reduced.

FIG. 20 illustrates how I/O and processing performed by a pipeline of N processing cores is accelerated by compression. The example shown in FIG. 20 assumes a 2:1 compression of core-to-core packets, as was discussed with FIG. 19. Timeline A illustrates a series of N {I/O, compute} rectangle pairs in a waveform data processing application that transmits uncompressed waveform data packets between N cores. The width of each rectangle represents the time taken for the I/O or compute operation. Timeline B illustrates the same processing steps, but using 2:1 compression for each I/O operation. Note that the duration of corresponding compute operations COMP1 to COMPN are identical to those shown in timeline A; the compute time for both applications is the same. However, because the I/O or data exchange times are reduced by a factor of 2 (2:1 compression), the overall process duration in timeline B is T2, which is shorter than the overall process duration in FIG. 20*a* of T1. While the overall speed-up (T1-T2) in process duration depends on the particular lengths of I/O and compute time, FIG. 20 makes it clear that waveform data compression applications will complete sooner if I/O between multiple cores that are configured in a processing pipeline use the present invention's configurable, low-latency, high-bandwidth compression and decompression blocks to accelerate I/O between cores. Applying compression of the present invention for other multi-core topologies, such as rings, stars, and meshes, may also accelerate data exchanges between cores.

For the example of FIG. 20, compute operations COMP1 to COMPN may represent threads executing on N processor cores. The time intervals [I/O or XCHG] represent the times required for communication of the waveform data along the pipeline of N processor cores. During the [I/O or XCHG] time intervals, the corresponding cores enter waiting modes. As shown in FIG. 20, compression reduces the time for data transfer, thus reducing the time that the cores are in waiting modes. The result is improved system performance, both in terms of lower time duration of the overall process and more efficient utilization of core computing resources.

Embodiments of the present invention are suitable for waveform data applications in which integers or floating-point data are exchanged between cores using packet-based or block-based data exchanges. The configurable compressor 620 is adaptable to the specific data type and the selected compression mode (lossless or lossy) for the waveform data being transmitted to the receiving core. The configurable compressor 620 inserts control information into the headers of the compressed packets. The configurable decompressor 720 determines the data type and other control parameters from the packet header of each received compressed packet. The configurable decompressor 720 applies the appropriate decompression operations to the compressed payload data in accordance with the data type and control parameters, such as the compression mode, for the particular compressed packet. The present invention is appropriate for a variety of network, bus, and storage applications, including (but not limited to) those described with FIG. 5, and including semiconductor memories such as on-chip cache (register files, SRAM, or DRAM), off-chip SRAM, DRAM, or flash, and magnetic media such as disk or tape drives.

A variety of implementation alternatives exist for the configurable compressor and decompressor. In a preferred implementation, the configurable compressor 620 is integrated directly on the same die with transmit packet buffers, so that waveform data are compressed with the lowest latency and the highest compression and decompression rate for packet transmission. Configurable compressor 620 and configurable decompressor 720 may operate at a real-time rate, that is, a rate that is at least as fast as the devices to which they interface, compressing waveform samples as quickly as they are provided, and decompressing waveform samples as quickly as they are consumed. Similarly, in a preferred embodiment the configurable decompressor 720 is integrated directly on the same die with receive packet buffers, so that upon packet reception, the waveform data are decompressed with the lowest latency and the highest compression and decompression rate, as described earlier. Alternatively, the configurable compressor 620 and configurable decompressor 720 may be implemented in a speed and latency-optimized assembly language implementation using the instruction set of the transmitting and receiving cores, respectively. Because the assembly language implementation will require multiple instruction cycles per compressed waveform data element, its speed and latency will be significantly higher than the preferred implementation.

In a multi-chip implementation, the configurable compressor 620 and/or configurable decompressor 720 are implemented on a separate die (i.e. in hardware) from the die upon which the communicating processors are implemented, where the separate compression and/or decompression die is on the same substrate and is thus in close proximity to the die in which the communicating processors are implemented. In this multi-chip implementation, the compressor and decompressor die could be developed as a separate product and later integrated with a variety of communicating processor die. The advantage of this multi-chip implementation is that it allows the compressor and/or decompressor die to be integrated at lower cost than that of the preferred implementation on the same die, since the die containing the communicating processors is often much larger (and thus more expensive both to design and to fabricate) than that die containing the configurable compressor 620 and/or configurable decompressor 720.

For certain applications the configurable compressor 620 and configurable decompressor 720 may be integrated in separate die, such as when a communications link sends waveform data uni-directionally. Such conditions occur when a source of waveform data is captured by one device (such as an ADC or data acquisition subsystem), while the processing of the compressed waveform data is performed by another device (such as an FPGA, CPU, GPU, or the like). Similarly for other applications the compressor may be integrated with the processing of the waveform data by an FPGA, CPU, GPU, or the like, while the compressed packets are received, decompressed, and the resulting waveform is provided to an output subsystem such as a DAC or other analog or digital signal generator.

Described herein, a method used in a waveform processing system having a plurality of processor cores and a communications fabric for transfer of data packets between the plurality of processor cores, wherein waveform data samples are represented in an integer format or a floating-point format, comprises:
  preprocessing a subset of the waveform data samples under the control of a preprocessor control parameter to generate compressor input samples;
  adjusting magnitudes of the compressor input samples under the control of a magnitude adjustment parameter to generate adjusted signal samples;
  compressing the adjusted signal samples under the control of a compression control parameter to generate compressed samples for a compressed packet payload;
  creating a packet header that includes an indicator of the preprocessor control parameter, an indicator of the magnitude control parameter, and an indicator of the compressor control parameter;
  combining the packet header and the compressed packet payload into a compressed packet; and
  providing the compressed packet at an interface to the communications fabric.

Additional implementation alternatives include the following. The configurable compressor 620 and configurable decompressor 720 may be implemented as custom intellectual property (IP) blocks for a target ASIC design process. The configurable compressor 620 and configurable decompressor 720 may be implemented in software on a CPU, GPU, DSP chip, or other multi-core processor. The configurable compressor 620 and configurable decompressor 720 can be implemented as part of a network-on-chip, fully connected switch, or partially connected switch implementation.

Embodiments of the configurable compressor 620 and configurable decompressor 720 can also be adapted to improve throughput, to reduce latency, or to reduce complexity. For instance, a plurality of preprocessors can be used to convert the floating-point {sign, exponent, mantissa} fields into a format that conforms to the expected input format of lossy compression adjustment block 622 and lossless compressor 624. The particular processor would then be chosen that reduces latency, that increases throughput, or that decreases complexity of compressor or decompressor, or a combination of all of these features. Preprocessors may also perform base conversion, such as from radix 2 to radix 10; the reasons for, and benefits of, such convenient base conversion are described in the IEEE-754 (2008) floating-point data standard.

Embodiments of present invention can also be integrated into a memory controller for DRAM, DDR, DDR2, or DDR3 external memory, thus implementing a configurable compressor for memory controllers that compresses and decompresses both integer and floating-point waveform data values stored in semiconductor (DRAM, flash, FRAM, etc.) memory external to a single-core or multi-core CPU. Similarly, the present invention can be integrated into a cache controller on the same die (or in the same package in a multi-chip module) to implement a configurable cache memory compressor and decompressor for waveform data.

While the preferred embodiments of the present invention have been illustrated and described, it will be clear that the invention is not limited to these embodiments only. Numerous modifications, changes, variations, substitutions and equivalents will be apparent to those skilled in the art, without departing from the spirit and scope of the invention, as described in the claims.

I claim:

1. In a system including a processor, a memory controller and a first memory device integrated on a chip and a second memory device located off the chip, a method for compressing waveform data for storage in the second memory device, comprising:
  receiving a request at the memory controller from the processor to write the waveform data to the second memory device, wherein the waveform data comprise a plurality of samples represented in an integer data format or a floating-point data format;
  receiving one or more compression control parameters from the processor at compression logic integrated with the memory controller;
  receiving the plurality of samples at the compression logic in the memory controller from the first memory device in response to the request from the processor;
  the compression logic compressing the plurality of samples in accordance with the compression control parameter to form a plurality of compressed samples for a compressed packet; and
  transferring the compressed packet to the second memory device, the second memory device storing the compressed packet, wherein a first one of the compression control parameters is a data type parameter of the samples, the data type parameter indicating the integer data format or the floating-point data format, wherein for the integer data format, each input sample consists of a first sign bit and a first plurality of mantissa bits and for the floating-point data format, each sample consists of a second sign bit, a second plurality of mantissa bits and a plurality of floating-point exponent bits, the method further comprising:

configuring said compressing to process the first sign bit and the first plurality of mantissa bits of each sample when the data type parameter indicates the integer data format; and configuring said compressing to process the second sign bit, the second plurality of mantissa bits and the plurality of floating-point exponent bits of each sample when the data type parameter indicates the floating-point data format.

2. The method of claim 1, wherein one of the compression control parameters is a compression mode parameter indicating a lossless compression mode or a lossy compression mode, wherein said compressing applies lossless compression operations or lossy compression operations to the samples in accordance with the compression mode parameter.

3. The method of claim 1, wherein one of the compression control parameters is a desired number of bits per compressed packet or a desired compression ratio.

4. The method of claim 1, wherein a second one of the compression control parameters is a compression mode parameter indicating a lossless compression mode or a lossy compression mode, wherein said data type parameter indicates the integer data format, said compressing further comprising:

applying lossless compression operations or lossy compression operations to the first sign bit and the first plurality of mantissa bits of each sample in accordance with the compression mode parameter.

5. The method of claim 1, wherein a second one of the compression control parameters is a compression mode parameter indicating a lossless compression mode or a lossy compression mode, wherein said data type parameter indicates the floating-point data format, said compressing further comprising:

separating the plurality floating-point exponent bits from the second sign bit and the second plurality of mantissa bits of each sample;

applying lossless compression operations to the plurality of floating-point exponent bits of each sample to produce a plurality of compressed floating-point exponents;

applying lossless compression operations or lossy compression operations to the second sign bit and the second plurality of mantissa bits of each sample in accordance with the compression mode parameter to form a plurality of compressed signs and mantissas; and providing the plurality of compressed floating-point exponents and the plurality of compressed signs and mantissas to the compressed packet.

6. The method of claim 1, wherein the system includes a plurality of processors integrated on the chip, the memory controller receiving requests form one or more of the processors to write respective waveform data to the second memory device, said compressing applied to respective pluralities of samples to form respective pluralities of compressed samples.

7. The method of claim 1, wherein the memory controller further comprises a direct memory access controller, wherein the compression logic is integrated with the direct memory access controller to perform said compressing.

8. In a system including a processor, a memory controller and a first memory device integrated on a chip and a second memory device located off the chip, a method for compressing waveform data for storage in the second memory device, comprising:

receiving a request at the memory controller from the processor to write the waveform data to the second memory device, wherein the waveform data comprise a plurality of samples represented in an integer data format or a floating-point data format;

receiving one or more compression control parameters from the processor at compression logic integrated with the memory controller;

receiving the plurality of samples at the compression logic in the memory controller from the first memory device in response to the request from the processor;

the compression logic compressing the plurality of samples in accordance with the compression control parameter to form a plurality of compressed samples for a compressed packet; and transferring the compressed packet to the second memory device, the second memory device storing the compressed packet, wherein one of the compression control parameters is a desired number of bits per compressed packet or a desired compression ratio and said compressing further comprises:

calculating a number of bits in the compressed samples per packet for one or more compressed packets;

comparing the number of bits in the compressed samples per packet to the desired number of bits per packet to determine a feedback parameter; and adapting said compressing in accordance with the feedback parameter.

9. In a system including a processor, a memory controller and a first memory device integrated on a chip and a second memory device located off the chip, a method for compressing waveform data for storage in the second memory device, comprising:

receiving a request at the memory controller from the processor to write the waveform data to the second memory device, wherein the waveform data comprise a plurality of samples represented in an integer data format or a floating-point data format;

receiving one or more compression control parameters from the processor at compression logic integrated with the memory controller;

receiving the plurality of samples at the compression logic in the memory controller from the first memory device in response to the request from the processor;

the compression logic compressing the plurality of samples in accordance with the compression control parameter to form a plurality of compressed samples for a compressed packet; and transferring the compressed packet to the second memory device, the second memory device storing the compressed packet, wherein the compressed packet further includes a header portion and a payload portion, the method further comprising:

providing at least one of the compression control parameters in the header portion; and providing the plurality of compressed samples in the payload portion.

10. In a system including a processor, a memory controller and a first memory device integrated on a chip and a second memory device located off the chip, a method for decompressing waveform data retrieved from the second memory device, comprising:

receiving at the memory controller a request from the processor to retrieve the waveform data from the second memory device, wherein the waveform data are represented by a plurality of compressed samples stored in the second memory device, wherein the plurality of compressed samples and one or more compression control parameters are contained in a compressed packet;

receiving the compressed packet from the second memory device at decompression logic integrated with the memory controller in response to the request;

the decompression logic decompressing the plurality of compressed samples of the compressed packet in accordance with the one or more compression control parameters to form a plurality of decompressed samples representing the waveform data; and providing the plurality of decompressed samples to the first memory device, the first memory device storing the plurality of decompressed samples for access by the processor, wherein a first one of compression control parameters is a data type parameter of the compressed samples, the data type parameter indicating an integer data format or a floating-point data format, wherein for the integer data format, the compressed packet includes compressed sign and mantissa data of the plurality of compressed samples, and for the floating-point data format, the compressed packet includes compressed floating-point exponent, sign and mantissa data of the plurality of compressed samples, the method further comprising:

configuring said decompressing to process the compressed sign and mantissa data to generate a first sign bit and a first plurality of mantissa bits of each decompressed sample when the data type parameter indicates the integer data format; and configuring said decompressing to process the compressed floating-point exponent, sign and mantissa data of the plurality of compressed samples to generate a second sign bit, a second plurality of mantissa bits and a plurality of floating-point exponent bits of each decompressed sample when the data type parameter indicates the floating-point data format.

11. The method of claim 10, wherein the one of the compression control parameters is a compression mode parameter indicating a lossless compression mode or a lossy compression mode, wherein said decompressing applies lossless decompression operations or lossy decompression operations to the plurality of compressed samples in accordance with the compression mode parameter.

12. The method of claim 10, wherein a second one of the compression control parameters is a compression mode parameter indicating a lossless compression mode or a lossy compression mode, wherein said data type parameter indicates the integer data format, said decompressing further comprising:

applying lossless decompression operations or lossy decompression operations in accordance with the compression mode parameter to the compressed sign and mantissa data to produce the first sign bit and the first plurality of mantissa bits of each decompressed sample in accordance with the integer data format.

13. The method of claim 10, wherein a second one of the compression control parameters is a compression mode parameter indicating a lossless compression mode or a lossy compression mode, wherein said data type parameter indicates the floating-point data format, said decompressing further comprising:

extracting the compressed floating-point exponent data and the compressed sign and mantissa data from the compressed packet;

applying lossless decompression operations to the compressed floating-point exponent data to form a plurality of decompressed floating-point exponents;

applying lossless decompression operations or lossy decompression operations to the compressed sign and mantissa data in accordance with the compression mode parameter to form a plurality of decompressed signs and mantissas; and combining the decompressed floating-point exponents with corresponding ones of the decompressed signs and mantissas to form the decompressed samples in accordance with the floating-point data format.

14. The method of claim 10, wherein the system includes a plurality of processors integrated on the chip, the memory controller receiving requests form one or more of the processors to read respective waveform data from the second memory device, wherein the respective waveform data are represented by respective pluralities of compressed samples stored in the second memory device, wherein said decompressing is applied to the respective pluralities of compressed samples to form respective pluralities of decompressed samples.

15. The method of claim 10, wherein the memory controller further comprises a direct memory access controller, wherein the decompression logic is integrated with the direct memory access controller to perform said decompressing.

16. In a system including a processor, a memory controller and a first memory device integrated on a chip and a second memory device located off the chip, an apparatus for compressing waveform data for storage in the second memory device, comprising:

the memory controller coupled to the processor and the first memory device, wherein the memory controller is operable to receive a request from the processor to write the waveform data to the second memory device, wherein the waveform data comprise a plurality of samples represented in an integer data format or a floating-point data format, the memory controller to retrieve the plurality of samples from the first memory device in response to the request; and compression logic integrated with the memory controller, the compression logic coupled to receive the plurality of samples retrieved from the first memory device and one or more compression control parameters from the processor, wherein the compression logic is operable to compress the plurality of samples in accordance with the one or more compression control parameters to form a plurality of compressed samples for a compressed packet, the compression logic coupled to provide the compressed packet to the second memory device for said storage, wherein one of the compression control parameters is a desired number of bits per compressed packet or a desired compression ratio, and said compression logic further comprises:

logic to calculate a number of bits in the compressed samples per packet for one or more compressed packets;

logic to compare the number of bits of compressed samples per packet to the desired number of bits per compressed packet to determine a feedback parameter; and logic to adapt compression operations in accordance with the feedback parameter.

17. The apparatus of claim 16, wherein one of the compression control parameters is a compression mode parameter indicating a lossless compression mode or a lossy compression mode, wherein said compression logic is operable in the lossless compression mode or the lossy compression mode in accordance with the compression mode parameter.

18. In a system including a processor, a memory controller and a first memory device integrated on a chip and a second memory device located off the chip, an apparatus for compressing waveform data for storage in the second memory device, comprising:
the memory controller coupled to the processor and the first memory device, wherein the memory controller is operable to receive a request from the processor to write the waveform data to the second memory device, wherein the waveform data comprise a plurality of samples represented in an integer data format or a floating-point data format, the memory controller to retrieve the plurality of samples from the first memory device in response to the request; and
compression logic integrated with the memory controller, the compression logic coupled to receive the plurality of samples retrieved from the first memory device and one or more compression control parameters from the processor, wherein the compression logic is operable to compress the plurality of samples in accordance with the one or more compression control parameters to form a plurality of compressed samples for a compressed packet, the compression logic coupled to provide the compressed packet to the second memory device for said storage,
wherein a first one of the compression control parameters is a data type parameter of the samples, the data type parameter indicating the integer data format or the floating-point data format, wherein for the integer data format, each sample consists of a first sign bit and a first plurality of mantissa bits and for the floating-point data format, each sample consists of a second sign bit, a second plurality of mantissa bits and a plurality of floating-point exponent bits, the compression logic further comprising:
first logic to compress sign bits and mantissa bits of respective samples;
second logic to compress floating-point exponent bits of respective samples;
logic to provide the first sign bit and the first plurality of mantissa bits of each sample to the first logic when the data type parameter indicates the integer data format; and
logic to provide the second sign bit and the second plurality of mantissa bits of each sample to the first logic and to provide the plurality of floating-point exponent bits to the second logic when the data type parameter indicates the floating-point data format.

19. The apparatus of claim 18, wherein a second one of the compression control parameters is a compression mode parameter indicating a lossless compression mode or a lossy compression mode, wherein said data type parameter indicates the integer data format, wherein said first logic is operable in the lossless compression mode or the lossy compression mode in accordance with the compression mode parameter.

20. The apparatus of claim 18, wherein a second one of the compression control parameters is a compression mode parameter indicating a lossless compression mode or a lossy compression mode, wherein said data type parameter indicates the floating-point data format, wherein said first logic is operable in the lossless compression mode or the lossy compression mode in accordance with the compression mode parameter and said second logic is operable in the lossless compression mode.

21. In a system including a processor, a memory controller and a first memory device integrated on a chip and a second memory device located off the chip, an apparatus for compressing waveform data for storage in the second memory device, comprising:
the memory controller coupled to the processor and the first memory device, wherein the memory controller is operable to receive a request from the processor to write the waveform data to the second memory device, wherein the waveform data comprise a plurality of samples represented in an integer data format or a floating-point data format, the memory controller to retrieve the plurality of samples from the first memory device in response to the request; and
compression logic integrated with the memory controller, the compression logic coupled to receive the plurality of samples retrieved from the first memory device and one or more compression control parameters from the processor, wherein the compression logic is operable to compress the plurality of samples in accordance with the one or more compression control parameters to form a plurality of compressed samples for a compressed packet, the compression logic coupled to provide the compressed packet to the second memory device for said storage,
wherein the compressed packet further includes a header portion and a payload portion, the compression logic further comprising:
logic to provide at least one of the compression control parameters to the header portion; and
logic to provide the plurality of compressed samples to the payload portion.

22. The apparatus of claim 21, wherein the system includes a plurality of processors integrated on the chip, wherein the memory controller is coupled to one or more of the processors to receive requests from respective processors to write respective waveform data to the second memory device, wherein said compression logic is applied to respective pluralities of samples to produce respective pluralities of compressed samples.

23. The apparatus of claim 21, wherein the memory controller further comprises a direct memory access controller, wherein the compression logic is integrated with the direct memory access controller.

24. In a system including a processor, a memory controller and a first memory device integrated on a chip and a second memory device located off the chip, an apparatus for decompressing waveform data retrieved from the second memory device, comprising:
the memory controller coupled to the processor and the first memory device, wherein the memory controller is operable to receive a request from the processor to read the waveform data from the second memory device, wherein the waveform data are represented by a plurality of compressed samples stored in the second memory device, wherein the plurality of compressed samples and one or more compression control parameters are contained in a compressed packet, the memory controller coupled to the second memory device to retrieve the compressed packet from the second memory device in response to the request; and decompression logic integrated with the memory controller, the decompression logic coupled to receive the compressed packet retrieved from the second memory device, wherein the decompression logic is operable to decompress the plurality of compressed samples in accordance with the one or more compression control parameters to form a plurality of decompressed samples representing the waveform data, the decompression logic coupled to provide the plurality of decompressed samples to the first memory device, the first memory device storing the plurality of decompressed samples for access by the processor, wherein a first one of compression control parameters is a data type parameter of the compressed samples, the data type parameter indicating an integer data format or a floating-point data format, wherein for the integer data format, the compressed packet includes compressed sign and mantissa data of the plurality of compressed samples, and for the floating-point data format, the compressed packet includes compressed floating-point exponent, sign and mantissa data of the plurality of compressed samples, the decompression logic further comprising:

first logic to decompress compressed sign and mantissa data of respective compressed samples to form decompressed signs and mantissas;

second logic to decompress compressed floating-point exponent data of respective compressed samples to form decompressed floating-point exponents;

logic to provide the compressed sign and mantissa data of the compressed packet to the first logic when the data type parameter indicates the integer data format; and logic to provide the compressed sign and mantissa data of the compressed packet to the first logic and to provide the compressed floating-point exponent data of the compressed packet to the second logic when the data type parameter indicates the floating-point data format.

25. The apparatus of claim 24, wherein the one of the compression control parameters is a compression mode parameter indicating a lossless compression mode or a lossy compression mode, wherein said decompression logic is operable to apply lossless decompression operations or lossy decompression operations in accordance with the compression mode parameter.

26. The apparatus of claim 24, wherein a second one of the compression control parameters is a compression mode parameter indicating a lossless compression mode or a lossy compression mode, wherein said data type parameter indicates the integer data format, wherein said first logic is operable to apply lossless decompression operations or lossy decompression operations in accordance with the compression mode parameter.

27. The apparatus of claim 24, wherein a second one of the compression control parameters is a compression mode parameter indicating a lossless compression mode or a lossy compression mode, wherein said data type parameter indicates the floating-point data format, wherein said first logic is operable in the lossless compression mode or the lossy compression mode in accordance with the compression mode parameter and said second logic is operable in the lossless compression mode, said compression logic further comprising:

logic to combine the decompressed floating-point exponents with corresponding ones of the decompressed signs and mantissas to form the decompressed samples in accordance with the floating-point data format.

28. The apparatus of claim 24, wherein the system includes a plurality of processors integrated on the chip, wherein the memory controller is coupled to one or more of the processors to receive requests from respective processors to read respective waveform data from the second memory device, wherein the respective waveform data are represented by respective pluralities of compressed samples stored in the second memory device, said decompression logic applied to the respective pluralities of compressed samples to form respective pluralities of decompressed samples.

29. The apparatus of claim 24, wherein the memory controller further comprises a direct memory access controller, wherein the decompression logic is integrated with the direct memory access controller.

* * * * *